(12) United States Patent
Toda

(10) Patent No.: US 6,397,048 B1
(45) Date of Patent: May 28, 2002

(54) SIGNAL PROCESSING APPARATUS AND COMMUNICATION APPARATUS

(75) Inventor: Manabu Toda, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/357,811

(22) Filed: Jul. 20, 1999

(30) Foreign Application Priority Data

Jul. 21, 1998 (JP) .......................................... 10-205610

(51) Int. Cl.$^7$ ................................................. H04B 1/26
(52) U.S. Cl. ....................... 455/131; 375/316; 455/263; 455/307
(58) Field of Search ................................ 455/307, 260, 455/265, 131; 375/324, 316, 340, 350

(56) References Cited

U.S. PATENT DOCUMENTS

| 5,361,219 | A |   | 11/1994 | Shou et al. |
| 5,375,146 | A | * | 12/1994 | Chalmers .................... 375/344 |
| 5,416,370 | A |   | 5/1995 | Takatori et al. |
| 5,493,581 | A | * | 2/1996 | Young et al. ............... 375/345 |

FOREIGN PATENT DOCUMENTS

| JP | 6-46010 A | 2/1994 |
| JP | 6-162230 A | 6/1994 |
| JP | 6-168349 A | 6/1994 |
| JP | 9-135149 A | 5/1997 |
| JP | 10-163912 A | 6/1998 |

* cited by examiner

Primary Examiner—Daniel Hunter
Assistant Examiner—Nick Corsaro
(74) Attorney, Agent, or Firm—Nixon & Vanderhye, P.C.

(57) ABSTRACT

An object of the present invention is to integrate circuits for frequency conversion processing of an input signal of the GHz band. In a receiver, an input signal from an antenna is amplified after components thereof outside a frequency band for communication network being removed, and is supplied to an arithmetic processing unit. A plurality of sampling circuits within the arithmetic processing unit respond to a plurality of clock signals of which frequencies are equal and of which phases are different, respectively, and sample the input signal after amplification. The sum-of-products arithmetic unit within the arithmetic processing unit responds any one of the clock signals and performs sum-of-products operation periodically using a plurality of sample signals exhibiting the sampling results of all the sampling circuits, respectively. A signal outputted from the sum-of-products arithmetic unit includes a reflected component equivalent to the component within the frequency band of the input signal being frequency-converted. A channel selection unit extracts the reflected component from the signal and converts the carrier frequency of the reflected component into an intermediate frequency. A reflected component after conversion is demodulated.

14 Claims, 15 Drawing Sheets

SIGNAL PROCESSING APPARATUS AND COMMUNICATION APPARATUS

BACKGROUND OF THE INVENTION

1. Field of the Invention

The present invention relates to a communication apparatus which performs frequency conversion processing and to a signal processing apparatus advantageously used for the frequency conversion processing of the communication apparatus.

2. Description of the Related Art

Conventional receivers for high frequency radio multiplex communication or high frequency wired multiplex communication are provided with circuits for performing frequency conversion. Examples of such receivers are a portable telephone terminal, an automobile telephone terminal, a transceiver, a television broadcasting receiver, a radio broadcasting receiver, a cable television (CATV) receiver and the like.

FIG. 16 is a block diagram illustrating an electrical configuration of an FM (Frequency Modulation) radio receiver 1 according to a prior art. The FM radio receiver 1 uses a plurality of channels within a predetermined frequency band, and is utilized in a radio communication network which transmits carrier waves frequency-modulated by base band signals to a plurality of FM radio receivers, respectively, in parallel. The FM radio receiver 1 is, for example, used as a receiver unit of a portable telephone terminal in an analogue portable telephone network.

The FM radio receiver 1 is of a double-super-heterodyne system including an antenna 3, a high-frequency filter 4, a low noise amplifier 5, a first and a second frequency converting units 6, 7, an oscillation source 8, a first and a second intermediate frequency filters 9, 10, an amplifier-limiter 11, an FM demodulation unit 12, a base band voice processing unit 13, a speaker 14 and a control unit 15. The first and the second frequency converting units 6, 7 include first and second mixers 16, 18 and first and second local frequency oscillators 17, 19, respectively.

The antenna 3 receives an electromagnetic wave and outputs a receive signal corresponding to the received electromagnetic wave. After signal components outside the predetermined frequency band are removed by the high frequency filter 4, the receive signal is amplified by the low noise amplifier (LNA) 5, and then supplied to the first mixer 16. The first local frequency oscillator 17, using a reference oscillation signal having a predetermined reference frequency oscillated by the oscillation source 8, generates a first local oscillation signal having a frequency defined based on a designated frequency designated by an operator of the FM radio receiver 1 or a predetermined designated frequency, and the frequency of the receive signal to supply it to the first mixer 16.

The first mixer 16 mixes the first local oscillation signal and the receive signal to generate a first intermediate frequency signal having a predetermined first intermediate frequency. The first intermediate frequency filter 9 performs filtering of passing only components within a frequency band of a predetermined band width including the designated frequency from the first intermediate frequency signal for channel selection. After being filtered, the first intermediate frequency signal is supplied to the second mixer 18.

The second local frequency oscillator 19, using the reference oscillation signal, generates and outputs a second local oscillation signal based on the frequency of the intermediate frequency signal after filtering and a second intermediate frequency. The second mixer 18 mixes the second local oscillation signal and the first intermediate frequency signal after filtering, and generates a second intermediate frequency signal having a predetermined second intermediate frequency. The second intermediate frequency filter 10 performs filtering for passing only components of the channel including the designated frequency from the second intermediate frequency signal for channel selection. The second intermediate frequency signal after filtering is supplied to amplifier-limiter 11.

The amplifier-limiter 11 amplifies the second intermediate frequency signal after filtering, and limits the amplitude of the second intermediate signal after amplification so as to remove amplitude modulation (AM: amplitude modulation) components. The FM demodulation unit 12, to reconstruct the base band signal, performs frequency discrimination on the second intermediate frequency signal after amplitude limitation. The base band voice processing unit 13 performs a processing defined in the radio communication network on the resultant signal of the frequency discrimination, and supply the signal to the speaker 14 or the control unit 15. The speaker 14 electroacoustically converts the signal after the processing to output the resultant sound. In the case where the signal after the processing represents protocol control data or user data, the control unit 15, based on the data, performs processing relating to the control of the entire FM radio receiver 1. The above describes the FM radio receiver 1.

In the FM radio receiver 1, the high frequency filter 4 and the first and the second intermediate frequency filters 9, 10 are generally formed of a dielectric material or ceramic material, and the low noise amplifier 5, the amplifier-limiter 11, the FM demodulation unit 12, the base band voice processing unit 13 and the first and the second mixers 16, 18 are implemented by semiconductor elements. Therefore, it is difficult to integrate the high frequency filter 4 and the first and the second intermediate frequency filters 9, 10 with the low noise amplifier 5, the amplifier-limiter 11, the FM demodulation unit 12, the base band voice processing unit 13 and the first and the second mixers 16, 18 into one integrated circuit.

Recently, radio communications utilizing a higher frequency band such as a G (giga) Hz band than that of the conventional radio communications have been proposed. To apply a communication apparatus with the same configuration as the FM radio receiver 1 for the radio communication using GHz band, each component of the communication apparatus is required to operate at a higher operating frequency than that of the conventional FM radio receivers. Generally, in the case where each of the filters 4, 9, 10 is implemented by a semiconductor circuit, that is, each of the filters 4, 9, 10 is implemented by a so-called digital filter, when the filters 4, 9, 10 are operated at the operating frequency proper to the radio communication using the GHz band, there is often the case that characteristics required for the radio communication is not obtained. This is because, the upper limit operating frequency of the semiconductor circuit is determined due to the configuration and the characteristics of the circuit itself, and if the circuit is operated at a frequency higher than the upper limit operating frequency, the operation will become unstable.

Japanese Unexamined Patent Publication JP-A 9-135149 (1997) discloses that, in a digital filter which performs digital filtering for processing digital coded signals, a technology to reduce the operating frequency of components within the digital filter. The digital filter includes one input portion, one switch, a plurality of FIFO type memories and a plurality of multipliers. A plurality of sets of objective data to be processed are acquired by sampling a signal to be inputted at an input sampling frequency Fe.

The objective data to be processed arrives at the input portion sequentially with the input sampling frequency Fe. The switch is interposed between the input portion and each of the memories, and in response to the arrival of the data, distributes the plurality of sets of data into the plurality of memories to be stored therein. Each of the multipliers operates according to a clock signal of a clock frequency which is L/M times the input sampling frequency Fe, and determines each of the product of the data memorized in each of the memories and one of plurality of predetermined coefficients. The above mentioned any one of the coefficients are changed whenever one period of the clock signal passes. Both L, M are integers and L/M is a value less than one.

In the digital filter disclosed in JP-A 9-135149, the switch operates at the input sampling frequency. Therefore, in the case where the components constituting the digital filter are integrated to form one integrated circuit, if the input sampling frequency is raised to the GHz band, for example, there is a possibility that the operation of the switch becomes unstable. Therefore, it is difficult to integrate the digital filter and use it for the GHz band radio communication.

Japanese Unexamined Patent Publication JP-A 6-46010 (1994) discloses, in an apparatus which performs sampling of analogue signal and arithmetic processing using the result of sampling, a technique to perform these sampling and arithmetic processing at a speed higher than the operating speed specific to that apparatus. The digital signal processing apparatus in this patent publication is configured by arranging a plurality of processing units in parallel, each processing unit being constituted of an analogue/digital converter, an arithmetic circuit and a digital/analogue converter connected in series, and causes the plurality of processing units to operate based on a plurality of clock signals of different phases, respectively. The digital signal processing apparatus of JP-A 6-46010 includes a plurality of analogue/digital converters, a plurality of arithmetic circuits, a plurality of digital/analogue converters and a clock signal oscillator. Consequently, the number of components constituting the apparatus become large, so that it is difficult to miniaturize the apparatus and also the costs tend to rise.

Japanese Unexamined Patent Publication JP-A 10-163912 (1998) discloses, in a radio receiver, a sampling apparatus for converting the frequency of an inputted modulation signal to a frequency lower than that frequency. The sampling apparatus, first, samples a modulation signal at a sampling frequency which is higher than the signal band of the modulation signal, and performs decimation processing on the resultant signal of the sampling, and again, samples the signal after decimation processing to output the resultant signal. The sampling frequency of the first sampling is concretely twice as high frequency as the signal band of the modulation signal. The sampling frequency of the second sampling is lower than the sampling frequency of the first sampling.

In this way, in the sampling apparatus described above, since the modulation signal is sampled at the frequency higher than twice the signal band of the modulation signal, the higher the signal band of the modulation signal is, the higher the operating frequency of the circuit conducting the first sampling needs to be raised. Therefore, the higher the signal band of modulation signal is, the more difficult it is to lower the operating frequency of the sampling circuit. Still more, in the sampling apparatus described above, at the sampling of signal, is used a plurality clock signals which are different both in period and phase from each other. The configuration of the circuit which generates such clock signals tends to be complex.

SUMMARY OF THE INVENTION

An object of the invention is to provide a signal processing apparatus capable of operating at an operating frequency lower than a sampling frequency required for signal processing and of being readily miniaturized, and a communication apparatus using the signal processing apparatus.

In a first aspect, the invention provides a signal processing apparatus comprising:

clock signal generating means for generating a plurality of clock signals of which frequencies are mutually equal and of which phases are different from each other;

a plurality of sampling means to which an input signal including signal components as processing objects within a predetermined input frequency band is supplied in parallel, the sampling means sampling the input signal according to any one of the plurality of clock signals and outputting the sampled input signals sequentially as sample signals;

sum-of-products operating means for periodically finding, with a timing based on an operating frequency which is equal to the frequency of the plurality of clock signals, a total sum of products of each of the sample signals outputted from all of the sampling means respectively and each of a plurality of predetermined multiplication coefficients; and output filter means for only passing components within an output frequency band which is different from the input frequency band, in a sum-of-products signal which is constituted of the total sums of products aligned in order of being found.

According to the first aspect of the invention, the signal processing apparatus causes the plurality of sampling means sample one input signal. Since the clock signals supplied to the respective sampling means have phases different from each other, every sampling means samples the input signal once, while one period of the clock signal elapses. As a result, a multiphase sample signal constructed by aligning the sample signals outputted from all of the sampling means in order of being sampled becomes equal to the signal that is obtained by sampling the input signal at an effective sampling frequency higher than the frequency of the clock signals.

And the sum-of-products operating means performs sum-of-products operation for the multiphase sample signal based on the operating frequency equal to the frequency of the clock signals. Accordingly, any one of the plurality of clock signals or a clock signal of which frequency is equal to that of the plurality of clock signals and of which phase is different from that of the plurality of clock signals is supplied to the sum-of-products operating means, and the sum-of-products operating means operates based on the supplied clock signal. The sum-of-products operation is an operation for implementing a so-called digital filter or the like. As a result of this, the sum-of-products signal is the one which is derived by performing so-called decimation processing on the processing result of the sum-of-products operation, and thus includes reflected components of the signal components as processing objects. Since the output frequency band is different from the input frequency band, the output filter means only passes the reflected components within the sum-of-products signal as an output signal. Consequently, the output signal becomes equivalent of the signal obtained by frequency conversion of the input signal.

As described above, the signal processing apparatus can perform frequency conversion on the input signal which should be processed at the effective sampling frequency, by using the clock signals of which frequency is lower than the effective sampling frequency. Each of the sampling means and the sum-of-products operating means can both be implemented by a semiconductor circuit, and the output filter means can also be implemented by a semiconductor circuit as a so-called digital filter. Therefore, the signal processing apparatus can be configured only using semiconductor circuits of which upper limit operating frequency is lower than the effective sampling frequency. As a result, the signal processing apparatus can be configured only by semiconductor circuits, and it is possible to easily and stably covert the frequency of the signals which should be processed with a frequency higher than the upper limit operating frequency defined due to the configuration and the characteristics of the semiconductor circuits. For this reason, the signal processing apparatus is integrated easier than the conventional signal processing apparatus for frequency conversion using a local oscillator, a mixer and a filter formed of a ceramic material or dielectric material. Accordingly, the signal processing apparatus is easy to be miniaturized and to be lowered in its manufacturing costs.

In a second aspect of the invention, it is preferable that the signal processing apparatus further comprises multiplication coefficient changing means for changing each of the plurality of multiplication coefficients.

According to the second aspect of the invention, the signal processing apparatus further comprises the multiplication coefficient changing means in addition to the configuration of the signal processing apparatus of the first aspect of the invention. In the case where the sum-of-products operating means implements a digital filter, the filter characteristics of the digital filter changes as the multiplication coefficient change is changed. Therefore, by providing the multiplication coefficient changing means, it is possible to change the filter characteristics of the digital filter easily.

In a third aspect of the invention, it is preferable that the signal processing apparatus further comprises a plurality of re-sampling means interposed between the plurality of sampling means and the sum-of-products operating means, respectively, for sampling the sample signal outputted from each of the sampling means based on a clock signal delayed in phase from the clock signal supplied to each of the sampling means to output it to the sum-of-products operating means, wherein the clock signals supplied to each of the sampling means are mutually equal.

According to the third aspect of the invention, the signal processing apparatus further comprises the plurality of re-sampling means in addition to the configuration of the signal processing apparatus of the first aspect of the invention. Since the clock signals supplied to each of the re-sampling means are mutually equal, each of the re-sampling means supplies the sum-of-products operating means with the sample signal after re-sampling at the same time. Therefore, since the sample signals supplied to the sum-of-products operating means are in phase with each other, it is easy for the sum-of-products operating means to synchronize the operation timing between a plurality of the sampling means.

In a fourth aspect of the invention, it is preferable that the frequency of the clock signals is equal to or less than twice the upper limit frequency of the input frequency band; and the output frequency band is lower than the input frequency band.

According to the fourth aspect of the invention, the signal processing apparatus of the first aspect of the invention is configured so that the frequency of the clock signals is equal to or less than twice the upper limit frequency of the input frequency band; and the output frequency band is lower than the input frequency band. As a result, in the sum-of-products signal, the reflected components appear in a bandwidth lower than the input frequency band, and the output filter means only pass the reflected components within the lower band. Accordingly, the signal processing apparatus according to the fourth aspect of the invention can down-convert the input signals.

In a fifth aspect of the invention, it is preferable that the signal processing apparatus further comprises buffer amplification means provided in the previous stage of all of the sampling means.

According to the fifth aspect of the invention, the signal processing apparatus further comprises the buffer amplification means in addition to the configuration of the signal processing apparatus of the first aspect of the invention. Accordingly, the signal processing apparatus according to the fifth aspect of the invention can reduce interference noise among the plurality of sampling means. Further accordingly, the signal processing apparatus can reduce the effect of an input capacity of the plurality of sampling means on the input signal. As a result of above, the signal processing apparatus can operate with stability even when the effective sampling frequency is raised.

In a sixth aspect of the invention, it is preferable that the signal processing apparatus further comprises halt indication means for indicating a halt of sampling of the input signal, wherein the clock signal generating means halts the generation of clock signals while the halt indication means indicates the halt of sampling.

According to the sixth aspect of the invention, the signal processing apparatus further comprises a configuration regarding the control of the clock signal generating means in addition to the configuration of the signal processing apparatus of the first aspect of the invention. When the clock signals are not generated, all of the sampling means and the sum-of-products operating means halt the operations. As a result, the signal processing apparatus according to the sixth aspect of the invention can lower the power consumption consumed during the period where processing for input signal is not required in comparison with the case where clock signals are generated during the period.

In a seventh aspect of the invention, it is preferable that the plurality of clock signals are 4-phase clock signals.

According to the seventh aspect of the invention, in the signal processing apparatus of the first aspect of the invention, the clock signal generating means generates 4-phase clock signals. The 4-phase clock signals can easily be generated by using a so-called sine/cosine oscillation circuit. Therefore, the circuit scale of the clock signal generating means is reduced further than the case where clock signals other than 4-phase clock signals are generated. Consequently, the signal processing apparatus according to the seventh aspect of the invention can be reduced in the circuit scale, so that it is easy to miniaturize and reduce the manufacturing costs, and also it is possible to reduce the power consumption. Accordingly, the signal processing apparatus has a configuration suitable for integrating the entire signal processing apparatus to form a single integrated circuit.

In an eighth aspect of the invention, it is preferable that the signal processing apparatus further comprises a plurality of memory elements which are respectively connected in series to the next stage of each of the sampling means, wherein each of the sampling means supplies the sample signal to the sum-of-products operating means and at the same time stores the sample signal in the memory element in the next stage of the sampling means, and each of the memory elements transfers the stored sample signal to the memory element of the next stage to store therein, with a timing defined based on the clock signal supplied to each of the sampling means in the previous stage of each of the memory elements, and gives the sample signal to the sum-of-products operating means.

According to the eighth aspect of the invention, the signal processing apparatus further comprises a plurality of the memory elements in addition to the configuration of the signal processing apparatus according to the first aspect of the invention. Accordingly, the past sample signal obtained by the past sampling by each of the sampling means and the latest sample signal obtained by the present sampling of each of the sample signals are at the same time supplied to the sum-of-products operating means. Consequently, the sum-of-products operating means can perform sum-of-products operation based on the sample signals larger in number than the sampling means.

In a ninth aspect, the invention provides a communication apparatus comprising:

receiving means for receiving the input signal;

the signal processing apparatus according to any one of the first to eighth aspect of the invention; and demodulation means for demodulating an output signal outputted from the output filter means in the signal processing apparatus.

According to the ninth aspect of the invention, the communication apparatus performs frequency conversion on the received input signal by the signal processing apparatus, and demodulates the input signal after frequency conversion to obtain a desired base band signal. Consequently, in the communication apparatus, it is possible to perform frequency conversion of the input signal by means of circuit components which operate on the basis of based on the clock signal of a frequency lower than the effective sampling frequency. Therefore, since the signal processing apparatus is easy to be miniaturized and integrated, the communication apparatus is also easy to be miniaturized, to be integrated and to be reduced in its manufacturing costs.

In a tenth aspect of the invention, it is preferable that the communication apparatus further comprises intermediate filter means provided in the previous stage of the plurality of sampling means, and a plurality of intermediate sampling means interposed between the receiving means and the intermediate filter means, wherein each of the intermediate sampling means samples the input signal according to any one of all the clock signals, respectively, and sequentially outputs part of the input signal as an intermediate sample signal;

each of the intermediate filter means only passing signal components within a predetermined passing frequency band in an intermediate signal constructed by aligning the intermediate sample signals outputted from all of the intermediate sample means respectively in order of being sampled; and each of the sampling means samples the signal components within the passing frequency band in the intermediate signal.

According to the tenth aspect of the invention, the communication apparatus further comprises a configuration for frequency conversion in addition to the configuration of the communication apparatus according to the ninth aspect of the invention. As a result, the communication apparatus according to the tenth aspect of the invention has two means for performing operational processing for implementing a digital filter, which permits the processing for removing signal components of a given frequency band from the input signal at the same time as the frequency conversion processing. Accordingly, the two digital filters within the communication apparatus share the necessary role within the communication apparatus, resulting that the two digital filters are readily designed.

In an eleventh aspect of the invention, it is preferable that the communication apparatus further comprises:

detector means for detecting amplitude modulation components in the input signal; and filter controlling means which discriminates whether interference components interfering the signal components as processing objects are included in the input signal based on the detected amplitude modulation components, and only when the interference components are included, changes frequency characteristics of at least any one of the sum-of-products operating means, the intermediate filter means and the output filter means, to frequency characteristics for removing the interference components.

According to the eleventh aspect of the invention, the communication apparatus further comprises, in addition to the configuration of the communication apparatus according to the tenth aspect of the invention, a configuration for changing the frequency characteristics of at least one of the means among the sum-of-products operating means, the intermediate filter means, and output filter means. Accordingly, the communication apparatus according to the eleventh aspect of the invention, by way of at least one of the means, can remove the interference components from the input signal, in the case where the receiving means receives the signal components as processing objects and the interference components at the same time. Therefore, the receive performance of the communication apparatus increases. And all of the three means are a so-called digital filter. By adjusting the multiplication coefficient of the arithmetic processing of a digital filter, it is easy to change the frequency characteristics such as a pass band and a center frequency of the digital filter. In the communication apparatus, it is possible to readily set the frequency characteristics of at least one of the three means in response to the frequency band where the interference components exist. Therefore, the communication apparatus increases in its receive performance.

In a twelfth aspect of the invention, it is preferable that a frequency of the output signal is equal to an effective sampling frequency which is the product of the frequency of the clock signals and the number of the sampling means, or equal to the frequency which is one integers of the effective sampling frequency.

According to the twelfth aspect of the invention, in the communication apparatus according to the ninth aspect of the invention, the relationship between the clock frequency of the output signal and the effective sampling frequency is as described above. Consequently, a corresponding relationship between the sample signals outputted from each of the sampling means and a variable to be subscribed for each of the sample signals in the arithmetic expression indicating the arithmetic processing of the sum-of-products operating means is fixed. Accordingly, the communication apparatus according to the twelfth aspect of the invention can reduce the number of the sampling means appropriately according to the configuration of the arithmetic expression, in comparison with other types of communication apparatus as an object for comparison which lacks the above described relationship between the clock frequency of the output signal and the effective sampling frequency, and, can eliminate the circuits to generate clock signals which are supposed to be supplied to the omitted sampling means.

In a thirteenth aspect of the invention, it is preferable that an order of the sum-of-products operating means which is smaller by one than the number of sample signals used for one-time arithmetic processing thereof is smaller than a decimation number which is a ratio of the frequency of the sum-of-products signal to the frequency of a multiphase sample signal constructed by aligning the sample signals in time order of being sampled.

According to the thirteenth aspect of the invention, in the communication apparatus of the twelfth aspect of the invention, the communication apparatus has a configuration where the sum-of-products operating means performs one sum-of-products arithmetic processing using the sample signals of the number smaller than the decimation number. The decimation number is equal to the number of sample signals obtainable during one period of the clock signal, when the input signal is actually sampled at the effective sampling frequency. Consequently, in the communication apparatus according to the thirteenth aspect of the invention, the number of sampling means can be smaller than the decimation number and the clock signal generating means can be simplified. Accordingly, the communication apparatus can reduce the current consumption during the operation. And accordingly, in the case where the signal processing apparatus is integrated to form one integrated circuit, it is possible to miniaturize the integrated circuit and to reduce the manufacturing costs readily.

In a fourteenth aspect of the invention, it is preferable that the sum-of-products operating means performs arithmetic processing for implementing a finite impulse response FIR filter and that at least one of the plural multiplication coefficients in the arithmetic processing is zero.

According to the fourteenth aspect of the invention, in the communication apparatus according to the twelfth aspect of the invention, the sum-of-products operating means of the communication apparatus is a finite impulse response FIR filter with a coefficient of zero. Consequently, the communication apparatus according to the fourteenth aspect of the invention can omit sampling means for obtaining sample signals which should be multiplied by the coefficient of zero and part of the multiphase clock generating means for generating clock signals which should be supplied to the sampling means. Accordingly, the communication apparatus can reduce the current consumption during the operation. And accordingly, in the case where the signal processing apparatus is integrated to form one integrated circuit, the communication apparatus is easier in miniaturizing the integrated circuit and in eliminating the manufacturing costs than the communication apparatus before the omission.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
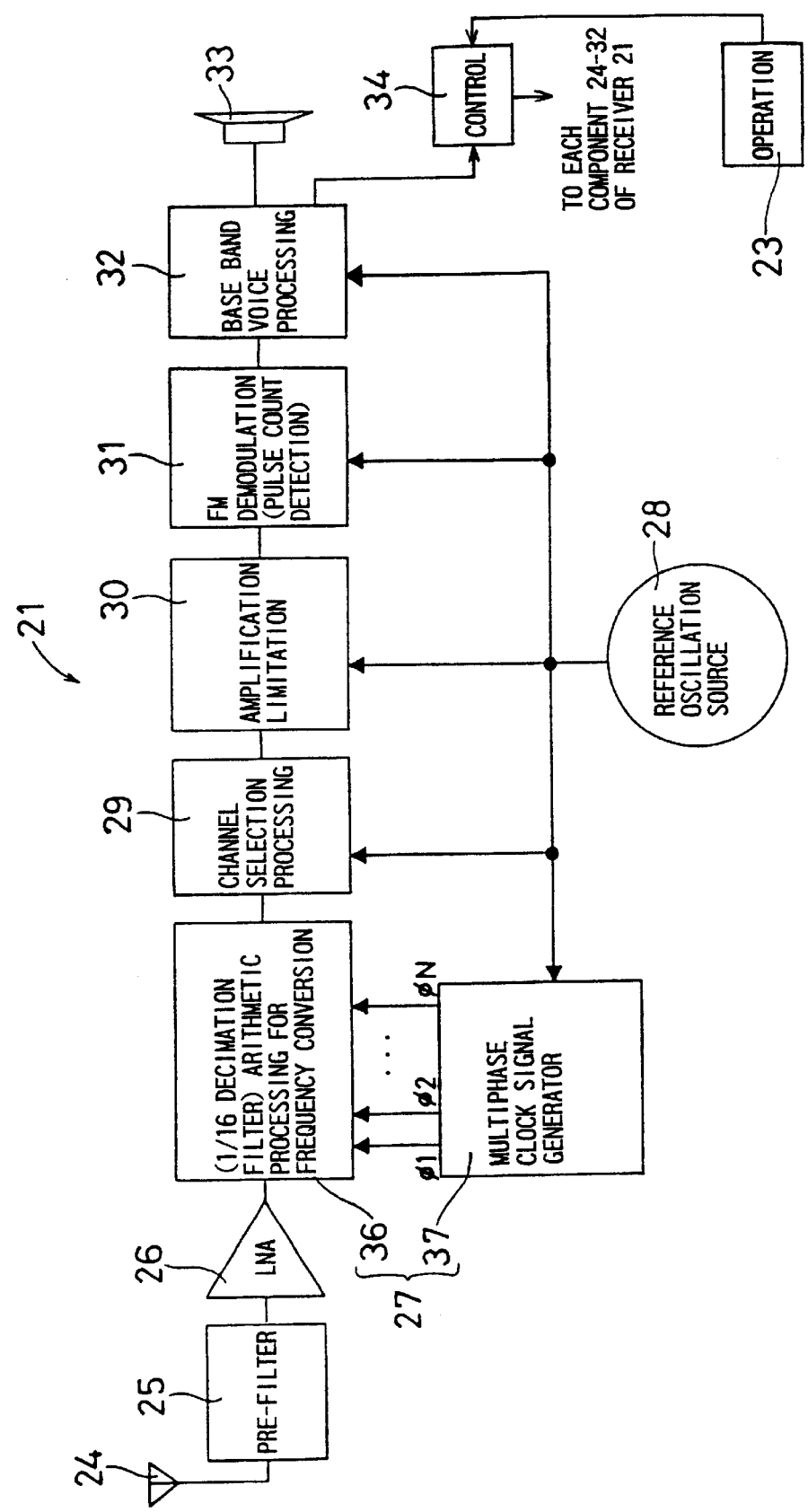
FIG. 1 is a block diagram showing an electrical configuration of a receiver 21 which is the first embodiment of the invention.

Now referring to the drawings, preferred embodiments of the invention are described below.

Figure 2:
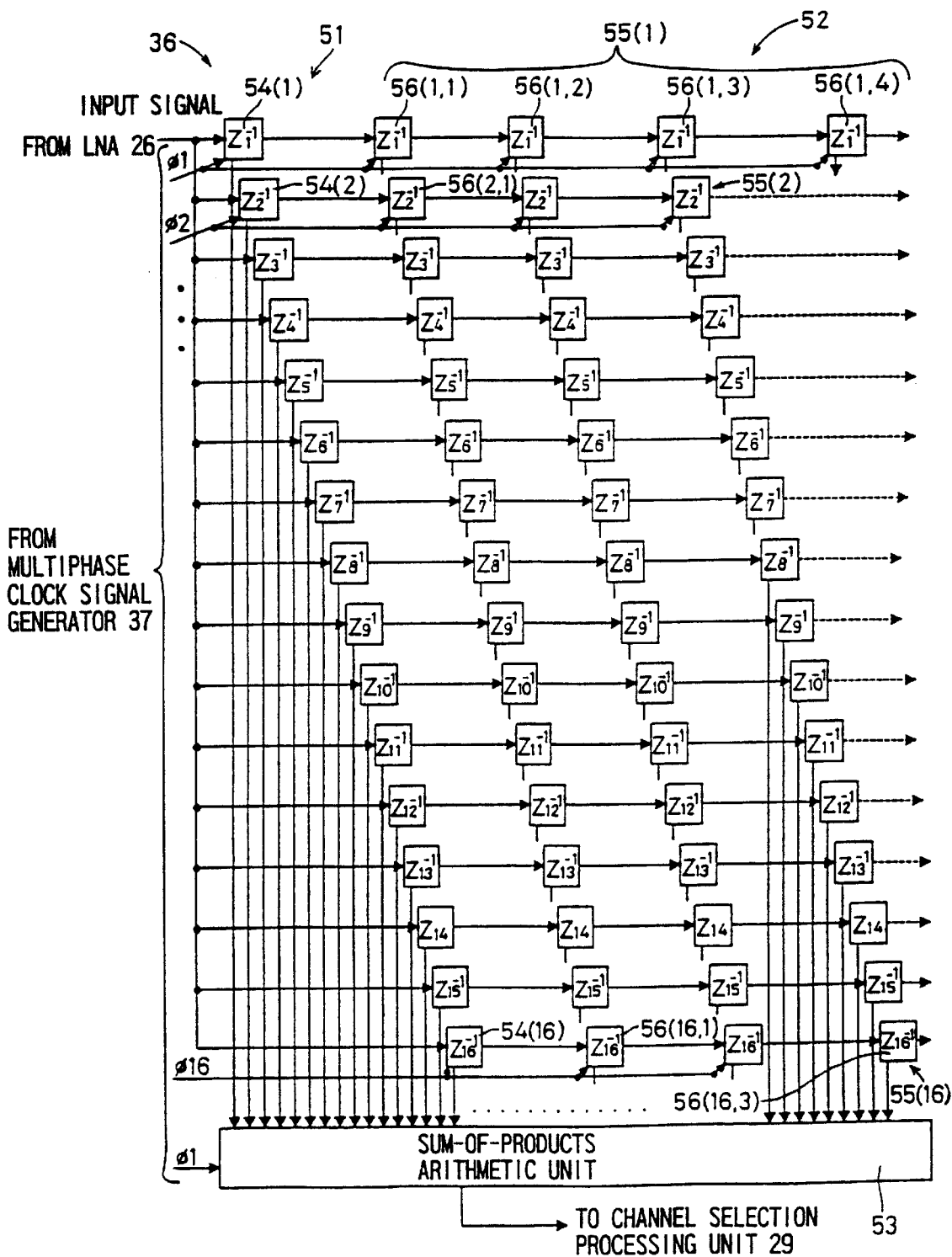
FIG. 2 is a block diagram showing a concrete electrical configuration of an arithmetic processing unit 36 of a signal processing unit 27 for frequency conversion within the receiver 21.

FIG. 1 shows a block diagram illustrating an electrical configuration of a receiver 21 which is a first embodiment of the invention. FIG. 2 is a block diagram illustrating a concrete configuration of an arithmetic processing unit 36 of a signal processing unit 27 for frequency conversion in the receiver 21. FIGS. 1 and 2 are referred together for the following description. Now the receiver 21 is assumed to be used for receiving signals transmitted from a transmitter in an FM radio communication network. The transmitter used in the FM radio communication network uses a plurality of channels within a predetermined frequency band for telecommunications, and transmits a plurality of carrier signals FM modulated by a plurality of base band signals, that is, a plurality of object signals, in parallel to a plurality of FM radio receivers while converting the signals to electromagnetic waves.

The receiver 21 includes an operation unit 23, an antenna 24, a pre-filter 25, a low noise amplifier 26, a signal processing unit 27 for frequency conversion, a reference oscillation source 28, a channel selection processing unit 29, an amplification limiting unit 30, an FM demodulation unit 31, a base band voice processing unit 32, a speaker 33 and a control unit 34. The signal processing unit 27 for frequency conversion includes the arithmetic processing unit 36 for frequency conversion and a multiphase clock signal generator 37. The amplification limiting unit 30 includes an amplifier and a limiter. The pre-filter 25 is implemented by an analogue filter formed of so-called dielectric materials, ceramic materials or the like. The signal processing unit 27 and the channel selection processing unit 29 are implemented by circuit devices capable of operating as a so-called digital filter.

The reference oscillation source 28 oscillates a reference oscillation signal of a predetermined local oscillation frequency. The reference oscillation signal is supplied to the channel processing unit 29, the amplification limiting unit 30, the FM demodulation unit 31, the base band voice processing unit 32 and the multiphase clock signal generator 37, respectively. The units 29 to 32 and the multiphase clock signal generator 37 operate with the timing based on the reference oscillation signal respectively. As a result, the units 29 to 32 and the multiphase clock signal generator 37 operate synchronously with each other.

On the basis of the information determined through operation of the operation unit 23 made by an operator of the receiver 21 in advance or by the system of the receiver 21 itself, or the information obtained by the receiver 21 itself through communications, a channel which used for transmitting the base band signals to be received or a center frequency of that channel is designated by the controlling unit 34. Hereafter the above-mentioned designated channel is called a "designated channel", the center frequency of the designated channel is called a "designated frequency." In response to the above indication of the designated frequency or the designated channel, the channel selection processing unit 29 sets a pass band WF3 of digital filter which is implemented by a channel selection filter processing described later in the channel selection processing unit 29 to the band having a center frequency according to the designated frequency. In this case, whenever the designated frequency is changed to change the pass band WF3, the coefficient of the arithmetic expression for filter processing for channel selection is changed to a numeric value according to the designated frequency after changed.

The antenna 24 receives an electromagnetic wave, and outputs an input signal which is an analogue signal representative of a frequency, a phase and an amplitude corresponding to the received electromagnetic wave. The input, signal is passed through the pre-filter 25 so as to remove so-called aliasing noise within the signal and to attenuate signal components having frequencies outside the frequency band for telecommunications in all of the signal components within the input signal. The pre-filter 25 is, for example, a band pass filter. The pass band of the pre-filter 25 always includes the above-mentioned frequency band for telecommunications regardless of the designated frequency band.

After amplified at the low noise amplifier 26, the input signal having passed through the pre-filter 25 is supplied to the arithmetic processing unit 36 for frequency conversion.

Figure 3:
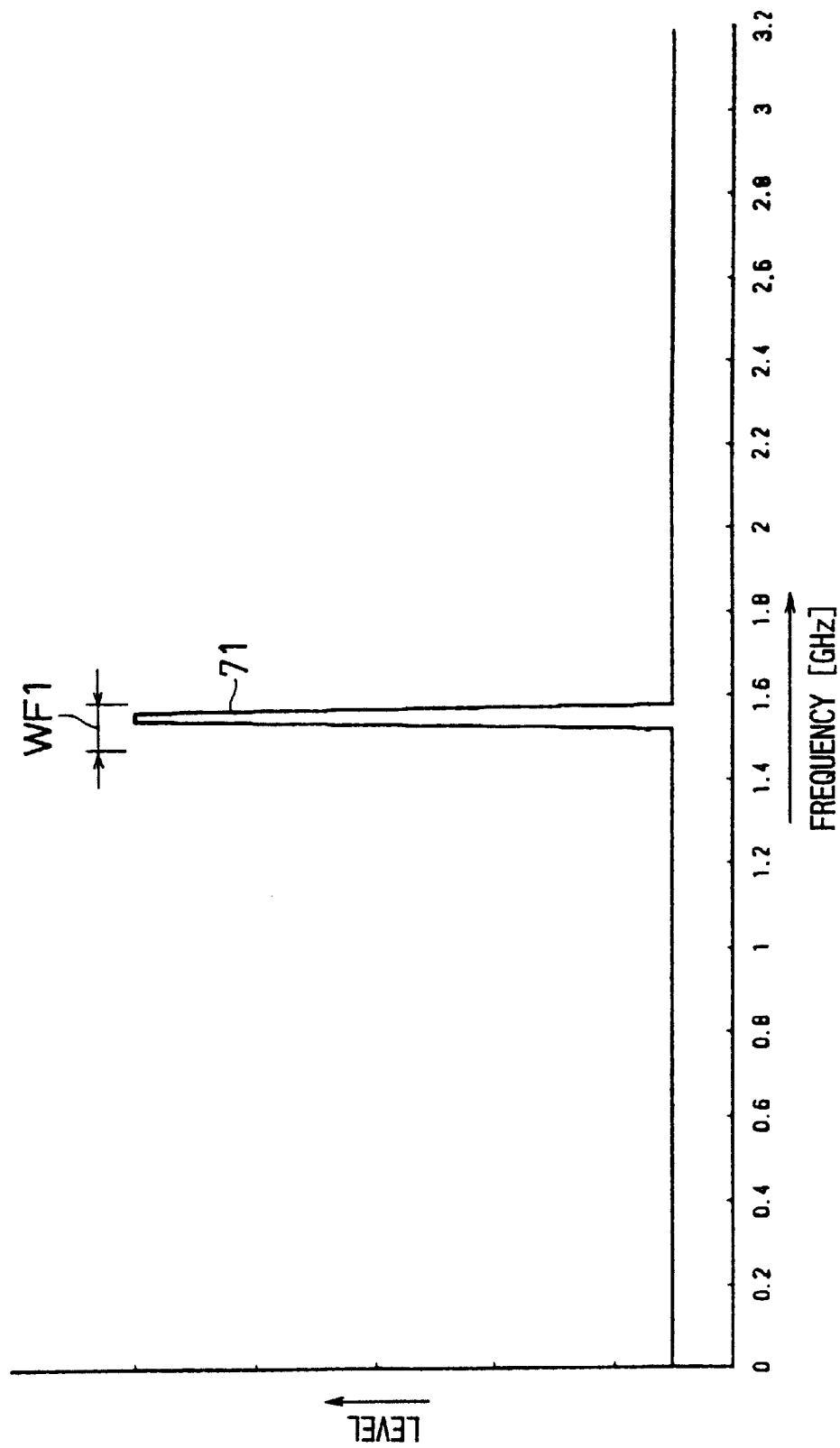
FIG. 3 is a graph showing a frequency spectrum of an input signal after amplification inputted to the signal processing unit 27 for frequency conversion in the receiver 21.

FIG. 3 shows a graph illustrating the frequency spectrum of the input signal after passing through the pre-filter 25, in the case where the frequency band for telecommunications spans 1500 MHz to 1600 MHz. It is appreciated from the graph of FIG. 3 that in the input signal after passing through the pre-filter 25 is attenuated so that the signal components outside the frequency band WF1 for telecommunications are smaller enough in level than the a signal component 71 within the frequency band WF1 for telecommunications.

FIGS. 1 and 2 are referred to again. The signal processing unit 27 is to convert the frequency of the input signal after amplification to the frequency which is one Nth of the frequency.

The multiphase clock signal generator 37 generates N-phase clock signals $\phi 1$–$\phi N$; The N-phase clock signals are synchronized with the reference oscillation signal oscillated by the reference oscillation source 28. N is a natural number larger than or equal to 2, for the description of the first embodiment, N is set at 16. The N-phase clock signals $\phi 1$–$\phi N$ are equal to each other in frequency, and are out of phase with each other. The N-phase clock signals $\phi 1$–$\phi N$ are always equal to each other in frequency regardless of the designated frequency. The N-phase clock signals $\phi 1$–$\phi N$ are all supplied to the arithmetic processing unit 36 for frequency conversion.

In the following descriptions, the larger the numeric value of the index n in the reference sign "$\phi n$" of a clock signal is, the larger the phase difference with the head clock signal $\phi 1$ is, and the larger that numeric value is, the more the phase advances. The phase difference between any two clock signals $\phi_n$ and $\phi_{n+1}$ of which frequencies are the closest to each other is one Nth of $2\pi$ ($2\pi/N$). Herein, n is a natural number which is not less than one and not more than N−1. Hereafter, the frequency of the clock signal is referred to as a clock frequency fc, and the period of the clock signal is referred to as a clock period Tc. The maximum value of the clock frequency fc is equal to or less than the maximum operating frequency of circuit elements constructing the arithmetic processing unit 36.

The multiphase sampling unit 51 operates in response to the N-phase clock signals $\phi 1$–$\phi N$, and samples the input signal after amplification with the effective sampling frequency fa which is N times the clock frequency fc: The input signal sampled, that is, sample signal is supplied to a matrix memory 52 and a sum-of-products arithmetic unit 53 every effective sampling period which is one Nth of the clock period Tc. The matrix memory unit 52 memorizes sample signals outputted from the multiphase sampling unit 51 at or before the point of time gone back from the present by the clock period Tc, that is, the past sample signals, and supply the past sample signals to the sum-of-products arithmetic unit 53. A plurality of sample signals outputted from the multiphase sampling unit 51 and a plurality of past sample signals outputted from the matrix memory unit 52 are aligned in the order of time in which samplings for obtaining these sample signals are performed, which is referred to as a multiphase sample signal.

The sum-of-products arithmetic unit 53 performs anti-aliasing filter processing to remove signal components outside the frequency band WF1 for telecommunications from the multiphase sample signal, and decimation processing to convert the frequencies of the multiphase sample signal. As a result of these processings, an input signal after frequency conversion is outputted from the sum-of-products arithmetic unit 53 of the arithmetic processing unit 36. The input signal after frequency conversion is supplied to the channel selection processing unit 29. The detail of the arithmetic processing unit 36 will be described later.

Figure 4:
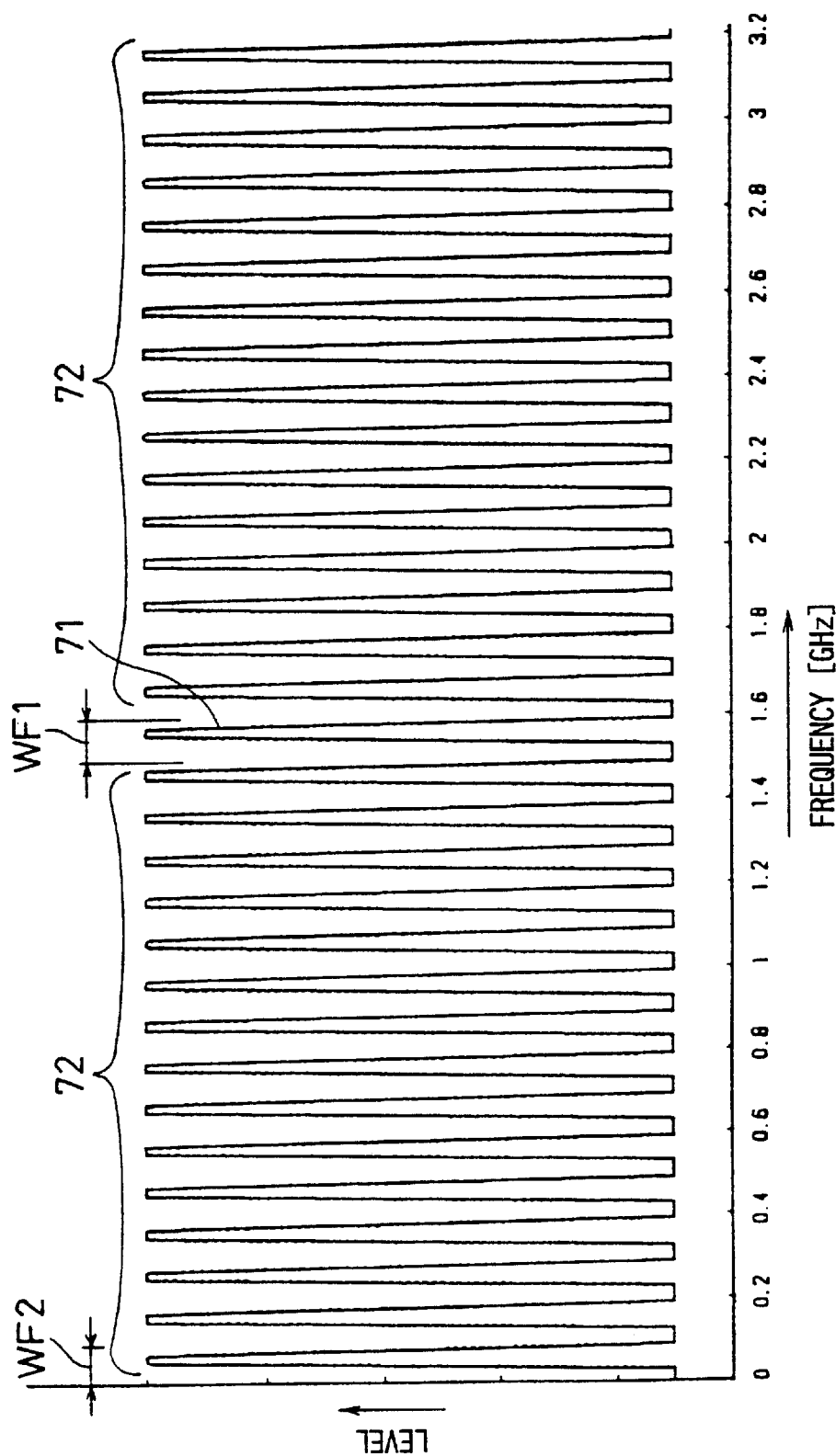
FIG. 4 is a graph showing a frequency spectrum of the input signal after frequency conversion outputted from the signal processing unit 27 for frequency conversion in the receiver 21.
Figure 5:
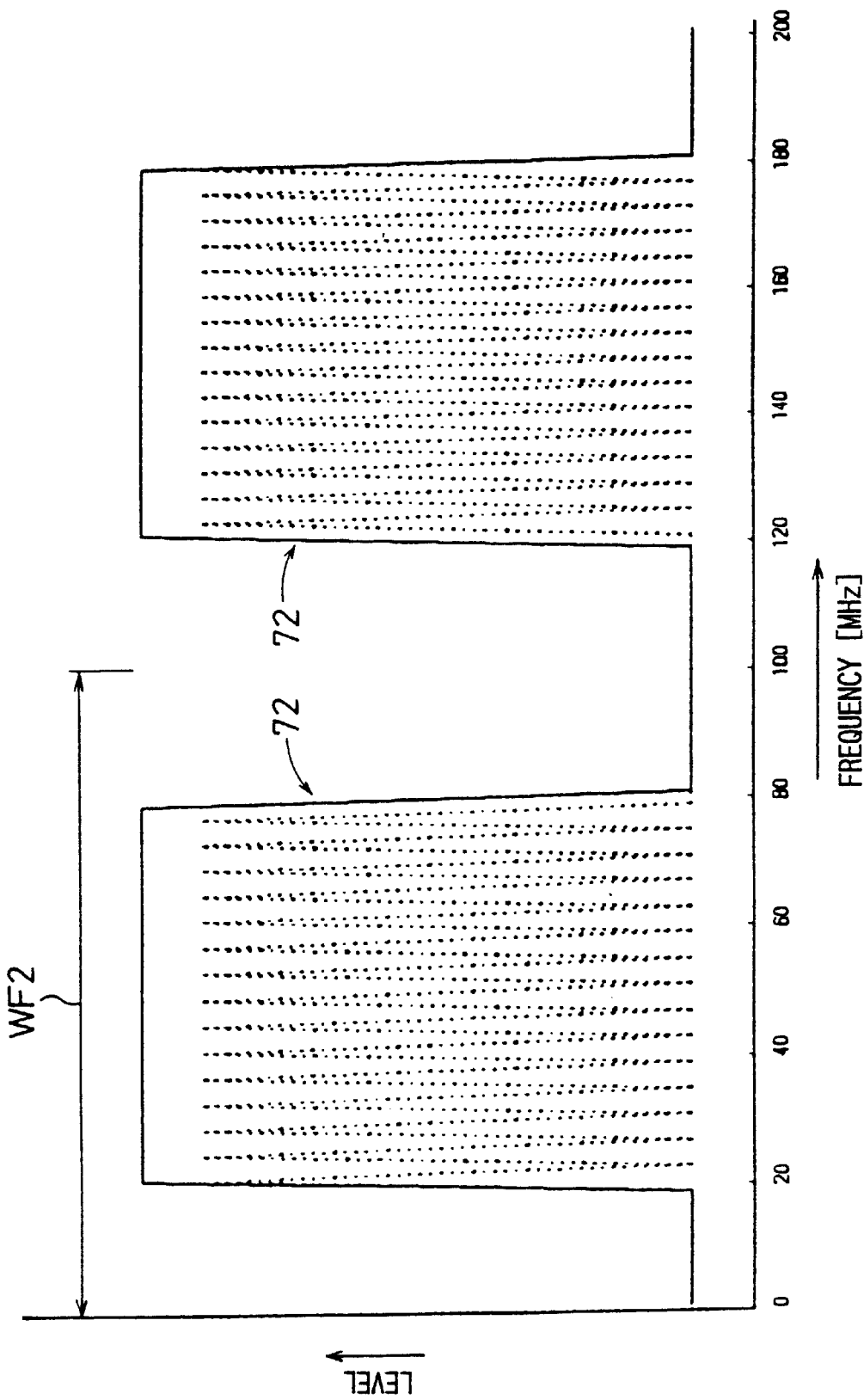
FIG. 5 is a partial enlarged view of the frequency spectrum shown in FIG. 4.

FIG. 4 shows a graph illustrating the frequency spectrum of the input signal after frequency conversion in the case where the frequency band WF1 for telecommunications spans 1500 MHz to 1600 MHz and the clock frequency fc is 200 MHz. FIG. 5 is a graph showing in enlarged dimension the region between 0 Hz and 200 MHz in the frequency spectrum of the input signal after frequency conversion in FIG. 4. FIGS. 4 and 5 are referred to together for the following description.

The input signal after frequency conversion includes, in addition to the signal component 71 within the frequency band WF1 for telecommunications, a plurality of reflected components 72 of the signal component 71. The reflected components 72 differs in level from the signal component 71 within the frequency band WF1 for telecommunications but equals to the same in other respects. Therefore, each of the reflected components 72 corresponds to the one obtained by converting the frequency of the signal component 71 within the frequency band WF1 for telecommunications. That is to say, for example, the reflected component 72 within a band WF2 spanning 0 Hz to 100 MHz of the input signal after operations of multiplications and additions equals to the one which is obtained by down-converting the signal component 71 within the frequency band WF1 by 1500 MHz for telecommunications. According to this frequency conversion, in order to reduce the effective sampling frequency to one-Nth (1/N), the component at 1600 MHz is inverted and shifted to the position of 100 MHz. Namely, the input signal after frequency conversion includes the reflected components 72 which are obtained by converting the components having frequencies of 1500 MHz to 1600 MHz of the input signal after amplification to have frequencies of 100 MHz to 0 MHz, and the reflected components 72 include all of the components corresponding to the signal components within a plurality of channels in the frequency band WF1 for telecommunications. Briefly, as for the above-mentioned reflected components, the component of the designated channel within the input signal before frequency conversion is subjected to the frequency conversion of shifting the frequency of that component of the designated channel.

FIGS. 1 and 2 are referred to again. The channel selection processing unit 29 performs filter processing for channel selection for extracting a component corresponding to the component of the designated channel from the input signal after frequency conversion, and performs decimation processing and interpolation processing for generating a signal including an intermediate frequency component having a carrier frequency of a predetermined certain frequency on the basis of the extracted component. The intermediate frequency component is what the frequency of the extracted component is converted into a predetermined intermediate frequency. The pass band WF3 of the digital filter implemented by the filter processing for channel selection has a center frequency the same as the frequency after the decimation conversion at the preceding stage mentioned above, corresponding to the designated frequency, and a band width thereof is the same as that of said designated channel. The general procedure of the decimation processing equals to that employed in the signal processing unit 27. Furthermore, the channel selection processing unit 29 performs filter processing for intermediate frequency to extract said intermediate frequency component from said signal including the intermediate frequency component. A pass band WF4 of a digital filter implemented by the filter processing for intermediate frequency has a center frequency of said intermediate frequency and a band width the same as that of a single channel. As a result, the channel selection processing unit 29 outputs said intermediate frequency component as a so-called intermediate frequency signal.

Figure 6:
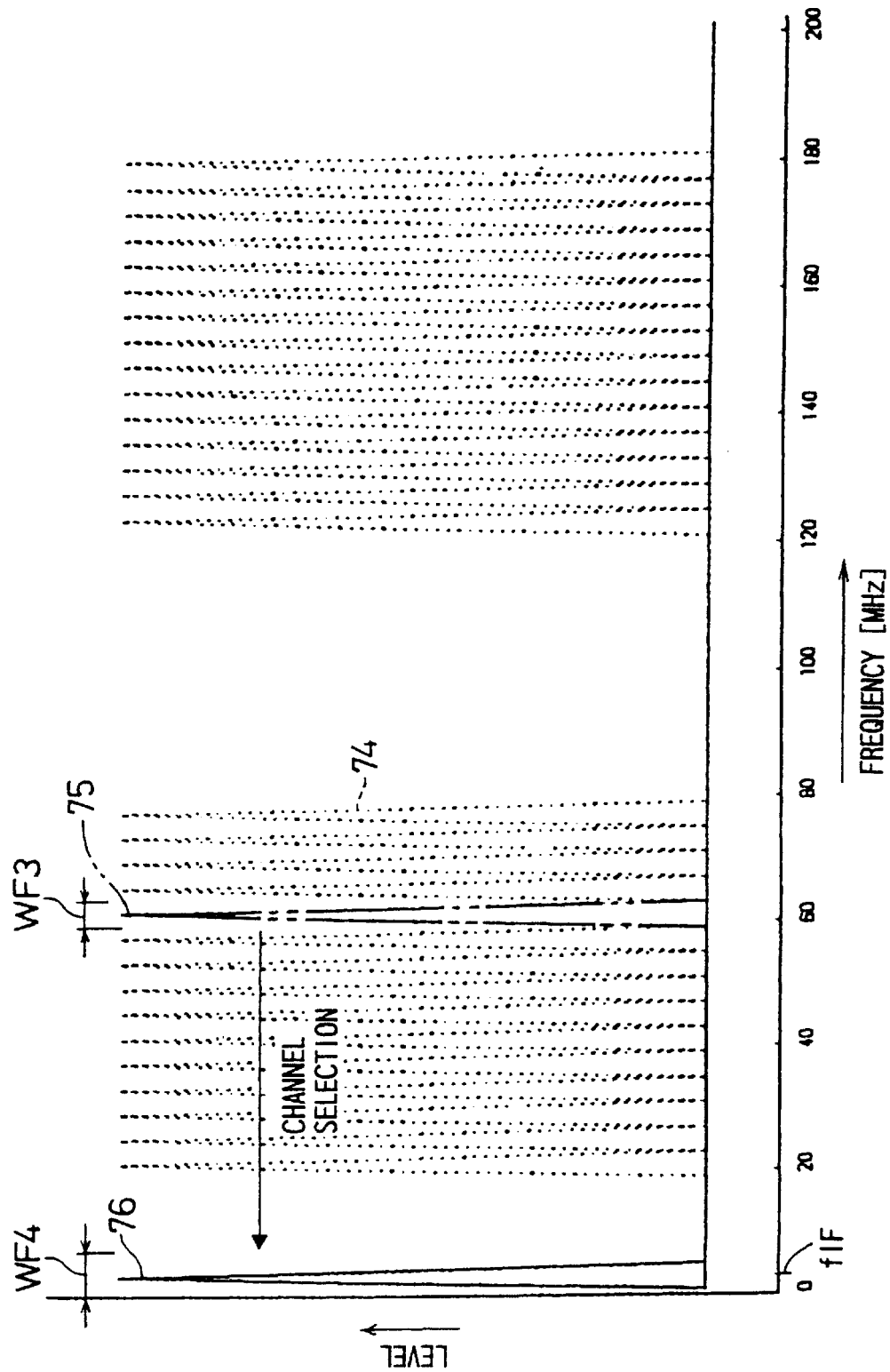
FIG. 6 is a graph showing a frequency spectrum of an intermediate frequency signal outputted from a channel selection processing unit 29 in the receiver 21.

FIG. 6 is a graph illustrating the frequency spectrum of the input signal after passing through the channel selection processing unit 29. The input signal 74 before frequency conversion by the channel selection processing unit 29, or the input signal after frequency conversion by the signal processing unit 27 includes components within a number of channels. Among those components, the component 75 within the pass band WF3 is the component corresponding to the designated channel. The intermediate frequency signal 76 includes a component equivalent to the component corresponding to the designated channel within the frequency band of the pass band WF4. The intermediate frequency signal is supplied to the amplification limiting unit 30.

FIG. 1 is referred to again. The amplifier in the amplification limiting unit 30 amplifies said intermediate frequency signal. The limiter in the amplification limiting unit 30 limits the amplitude of the intermediate frequency signal after amplification so as to remove the AM (Amplitude Modulation) components from the intermediate frequency signal. As a result, the input signal after amplitude limitation becomes a digital signal which includes the information regarding the base band signal transmitted through the designated channel within the frequency component. That is to say, the frequency of said input signal after amplitude limitation varies in accordance with the change in the base band signal.

The FM demodulation unit 31 performs so-called pulse count detection processing on the intermediate frequency signal after amplitude limitation, and filter processing on the resultant signal. As a result, a base band signal which is an analogue signal is outputted from the FM demodulation unit 31. The base band voice processing unit 32 performs processing specified in the radio communication network on the base band signal and thereafter supplies the signal to the speaker 33 or the control unit 34. The speaker 33 electroacoustically transduces the base band signal after said processing, and outputs the resultant sound. In the case where the base band signal after processing represents protocol control data or user data, the control unit 34 performs processing relating to the overall control of the receiver 21 based on that data. The above describes the receiver 21.

Referring to FIG. 2, the following describes the configuration and the operation of the arithmetic processing unit 36 in detail.

The multiphase sampling unit 51 includes N sampling circuits 54(1)–54(N). The matrix memory unit 52 includes N column memories 55(1)–55(n). Each column memory 55(n) includes one memory element or a plurality of memory elements connected in a column. N is a natural number and n is an arbitrary natural number not less than one and not more than N. Each column memory 55(n) is connected to the later stage of each sampling circuit 54(n), respectively.

In the specification and drawings, a plurality of memory elements constructing a certain column memory 55(n) are denoted by reference signs "56(n,1)"–"56(n,M)" successively in the order of directing from the first stage to the last stage under the connected state in column. M is a natural number. Also in the specification, all of the sampling circuits, all of the column memories and all of the memory elements are referred to generally as "sampling circuit 54," "column memory 55" and "memory element 56," respectively. Additionally, in FIG. 2, reference signs for components within the multiphase sampling unit 51 are properly omitted for the convenience.

The matrix memory unit 52 stores the past sampling results of the multiphase sampling unit 51. This is because, since the order L of the sum-of-products arithmetic unit 53 is more than the number of all the sampling circuits 54, together with the latest N sample signals obtained within one clock period Tc, it is necessary to input the sample signals which are obtained antecedent to the respective sample signals to the sum-of-products arithmetic unit 53. The number of all of the memory elements 56 within the matrix memory unit 52 equals to the difference obtained by subtracting the number N of sample signals outputted from the multiphase sample unit 51 during one clock period Tc from the order L of the sum-of-products arithmetic unit 53 and one. The order L of the sum-of-products arithmetic unit 53 is a number smaller by one than the number of the sample signals which is necessary in one arithmetic processing performed by the sum-of-products arithmetic unit 53. In the case where said difference is not an integral multiple of N, the numbers of memory elements in the first to XAth column memories 55(1)–55(XA) among all of the column memories 55 are larger by one than the number of memory elements within the Nth column memory 55(N), respectively. Herein, XA represents the remainder when said difference is divided by N.

From the multiphase clock signal generator 37, each of the clock signals n is supplied to each of the sampling circuits 54(n) and every memory element 56(n,1)–56(n,M) within the column memory 55(n) in the next stage of each of the sampling circuits 54(n), respectively. As a result, any supplied nth sampling circuit 54(n) and the nth column memory 56(n) in the next stage of the circuit 54(n) both operate in response to one supplied clock signal φn. In FIG. 2, signal lines for giving clock signals φn are properly omitted for the convenience.

In the specification, the numerical value of "n" in the reference sign φn for nth clock signal is identical to "n" s in the reference signs for all components to which said clock signal φn is supplied, that is, the nth sampling circuit 54(n), the nth column memory 55(n) and all the memory elements 56(n,1)–56(n,M) within the column memory 55. And the numeric vale of "n" in the sign "$Z_n^{-1}$" in each of the sampling circuits and memory elements in the drawing is the same as that of "n" of the clock signal φn that is supplied to said circuit and said element.

The input signal after amplification is supplied in parallel to all of the sampling circuits 54(1)–54(N) within the multiphase sampling unit 51, respectively, from the low noise amplifier 26. Each sampling circuit 54(n) samples the input signal after amplification with a timing based on the supplied clock signal φn, and supplies a sample signal indicating the sampling result to the sum-of-products arithmetic unit 53 and the first memory element 56(n,1) of the nth column memory 55(n) in the next stage of the sampling circuit 54(n). The above-mentioned timing is, for example, the timing when the signal waveform of the clock signal n rises, or the timing when the signal waveform falls.

Each of the memory elements 56(n,1)–56(n,M) within each of the column memory 55(n) operates with a timing defined based on the supplied clock signal φn. Accordingly, each of the memory elements 56(n,1)–56(n,M) operates in synchronization with the sampling circuit 54(n) which is in the previous stage of the column memory 55(n). To be more specific, the memory element 56(n,1) in the first stage within each of the column memories 55(n), following the above timing, supplies a sample signal stored therein at that point of time to the sum-of-products arithmetic unit 53 and the second memory element (n,2) within the column memories 55(n), and further erases that sample signal and newly memorize a sample signal supplied from the sampling circuit 54(n). The memory element 56(n,M) in the last stage within each of the column memories 55(n) supplies, following the above timing, a sample signal stored therein at that point of time to the sum-of-products arithmetic unit 53, and further erases that sample signal and newly memorize the sample signal supplied from the memory element (n,M−1) in the previous stage of the memory element 56(n,M). Each of the remaining memory elements 56(n,m) in the stages other than the first and last stages within each of the column memories 55(n), following the above timing, supplies a sample signal stored therein at that point of time to the sum-of-products arithmetic unit 53 and the memory element 56(n,m+1) in the next stage of the memory element 56(n,m), and further erase that sample signal and newly memorize a sample signal supplied from the memory element(n,m−1) in the previous stage of the memory elements 56(n,m). In FIG. 2, signal lines through which sample signals are supplied to the sum-of-products arithmetic unit 53 from each of the memory element 56(n,m) are partially omitted. Here, m is a natural number which is not less than one and not more than M.

Thorough the process as described above, every time one period of the supplied clock signal φn elapses, every sampling circuit 54(n) and every column memory 55(n) supply the sample signals to the sum-of-products arithmetic unit 53 whenever one period of the supplied clock signal φn passes.

As described above, all of the clock signals φ1–φN are of the same period while the phases thereof being advanced by 2π-Nth sequentially. Therefore, the respective timings T1–TN with which all of the sampling circuits 54(1)–54(N) sample the input signal are shifted sequentially by one-Nth of the clock period Tc. Accordingly, the above-mentioned input signal after amplification is sampled once each by all of the sampling circuits 54 within the clock period Tc. Therefore, the order of timings with which all of the sample signals to be supplied to the sum-of-products arithmetic unit 53, from former to latter, is: the first to Nth sampling circuits 54(1)–54(N); the first memory element 56(1,1) of the first column memory 55(1) to the first memory element 56(N,1) of the Nth column memory 55(N); and the second memory element 56(1,2) of the first column memory 55(1) to the second memory element 56(N,2) of the Nth column memory 55(N) and so forth.

All of the above sample signals are aligned in the order of sampling timing described above, which constitute the multiphase sample signal. The multiphase sample signal corresponds to the whole sampling results of the multiphase sampling unit 51. Consequently, the multiphase sample signal becomes equal to those obtained by sampling the input signal after amplification at the frequency of N times the clock frequency fc. Therefore, the effective sampling frequency fa of the multiphase sampling unit 51 is the frequency which is N times the clock frequency fc. For example, in the case where the clock frequency fc is 200 MHz, and all of the clock signals φ1–φ16 are out of phase with each other by 2π–16th (2π/16), the effective sampling frequency is 3200 MHz. Accordingly, the multiphase sampling unit 51 is constructed by only using the circuit elements operative at the clock frequency fc, and also capable of sampling the input signal at a frequency higher than the maximum operating frequency determined by the circuit configuration and the characteristics of the multiphase sampling unit.

FIG. 2 is referred to again. The sum-of-products arithmetic unit 53 has input terminals corresponding to all of the sampling circuits 54 and all of the memory elements 56, respectively. The sample signal outputted from each sampling circuit 54(n) and each memory element 56(n,m) is supplied to the corresponding input terminal, respectively. And the multiphase clock signal generator 37 supplies any one of the clock signals φ1–φN to the sum-of-products arithmetic unit 53. In the present embodiment, the first clock signal φ1 is supposed to be supplied.

The sum-of-products arithmetic unit 53 performs sum-of-products operation for filter processing for anti-aliasing at the timings determined on the basis of the supplied clock signal φ1. The digital filter realized by said filter processing is designed so that, when said sum-of-products arithmetic unit performs the filter processing with every timing determined based on the effective sampling frequency fa, the pass band becomes equal to the frequency band WF1 for telecommunications. The filter processing for realizing the digital filter thus designed is performed on the basis of the clock signal which is one-Nth the effective sampling frequency fa in frequency corresponds to the decimation processing.

Therefore, the frequency of the input signal after frequency conversion which is outputted from the sum-of-products arithmetic unit 53, that is, the frequency of a sum-of-products signal becomes one-Nth the frequency of a signal which will be obtained if the sum-of-products arithmetic unit 53 performs filter processing in synchronization with a clock signal of the effective sampling frequency fa. Furthermore, the input signal after frequency conversion includes reflected components of the signal component in the input signal before frequency conversion due to the decimation processing. This is because of the following reasons.

The decimation processing means a processing for thinning out part of numeric values from resultant series in determining the resultant series {Y0, Y1, . . . , YN} of arithmetic processing with respect to a limited length of series {X0, X1, . . . XN}. That is to say, the decimation processing corresponds to a processing that samples a signal representative of series before decimation at a predetermined sampling frequency, and the reflected components are included in the signal representative of series before decimation. The sampling frequency employed in the sampling corresponding to the decimation processing, that is, the frequency of the clock signal for determining the timing of sum-of-products operation, is set to be lower than the frequency which is twice as high as the maximum frequency within the frequency band WF1 for telecommunications.

A ratio of the frequency of the signal representative of the series before decimation to the frequency of the signal representative of the series after decimation is referred to as a decimation number. It is known that when the decimation number is N, the arithmetic unit for generating series to be subjected to the decimation processing outputs an arithmetic results every N times and needs not to perform arithmetic with respect to the remaining N–1 times outputs. This is because since the results of N–1 times operations are removed from the final processing result by decimation processing, omission of these operations has no effect on operations after the decimation processing. Specifically, in the sum-of-products arithmetic unit 53 where a processing result of the filter processing is subjected to the decimation processing, N–1 times operations in the N times operations for filter processing are omitted. That is to say, the sum-of-products arithmetic unit 53 performs the filter processing synchronously with the first clock signal φ1, whereby it is possible to perform the filter processing on the multiphase sample signal and the decimation processing on the result of the filter processing at the same time. Accordingly, the operation frequency of the sum-of-products arithmetic unit becomes lower than the effective sampling frequency fa. Therefore, it is possible to construct the sum-of-products arithmetic unit 53 with a circuit element which operates based on the clock frequency fc lower than the effective sampling frequency fa.

The sum-of-products operation is the operation to multiply the sample signal S0–SJ constituting the multiphase sample signal inputted from the respective input terminals by multiplication coefficients h0–hJ which are related to the respective input terminals and determine the total sum of the resultant products. Namely, the sum-of-products arithmetic unit 53 performs the operation represented by Expression 1, where "Y(p)" is a pth multiphase sample signal in N multiphase sample signals after operation processing obtained within a single clock period Tc. Here, p is a parameter representing time of which unit is the sampling period. In the case where the sum-of-products arithmetic unit 53 operates as a filter, the pass band, the center frequency, and the cut-off frequency thereof are determined in accordance with the concrete numeric values of the multiplication coefficients h0–hJ. The order L is equal to the number J obtained by subtracting one from the number (J+1) of multiphase sample signals.

$$Y(p) = \sum_{i=0}^{J} \{h(i) \times S(p-i)\} \tag{1}$$

Figure 7:
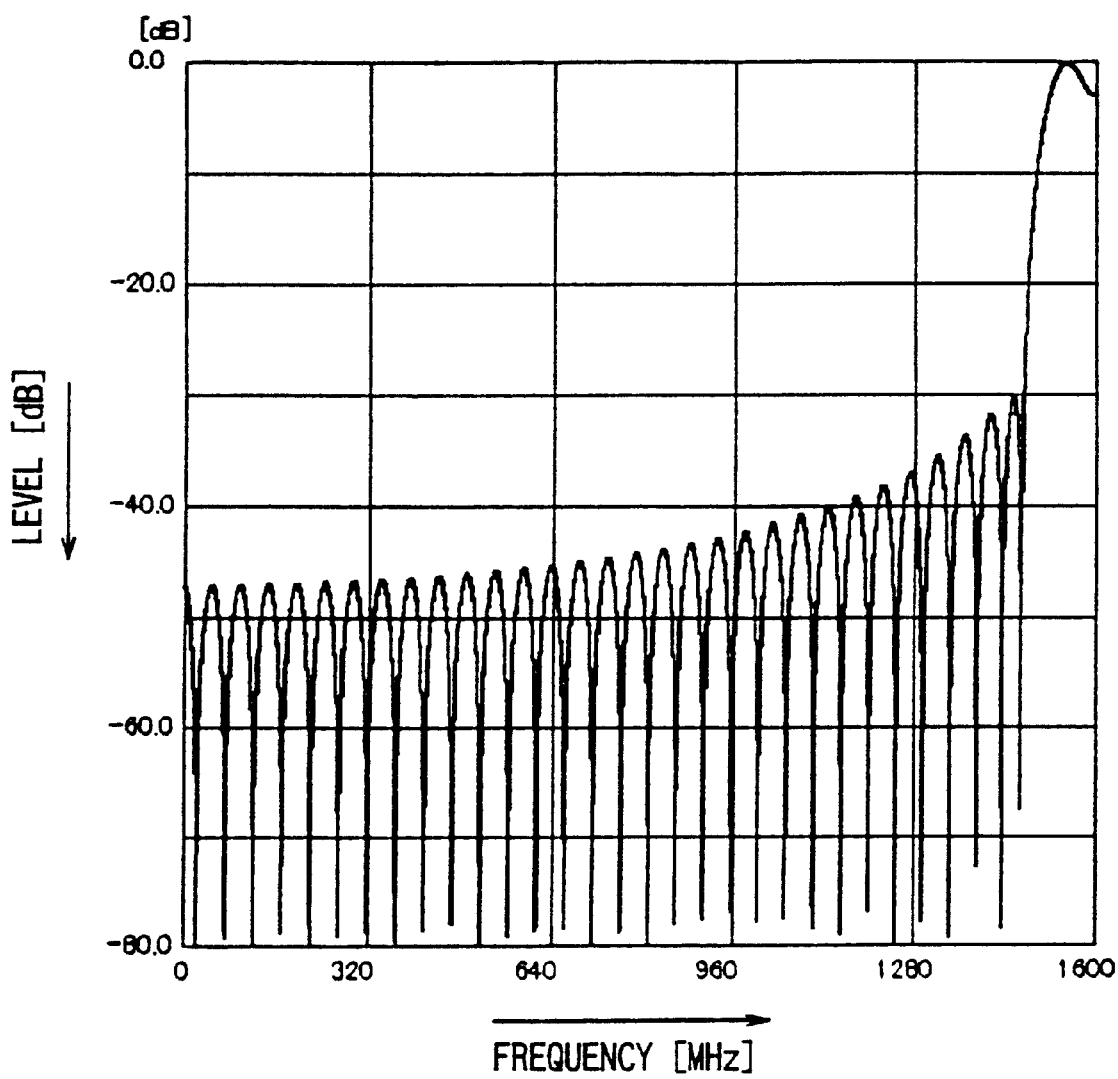
FIG. 7 is a graph showing passing characteristics of a digital filter implemented by an arithmetic processing of a sum-of-products arithmetic unit 53 in an arithmetic processing unit 36.

In this embodiment, it is assumed that the sum-of-products arithmetic unit 53 serves as an FIR band pass filter. For example, in the case where the processing object signal is the multiphase sample signal, that is, signals obtained by being sampled at the frequency 3200 MHz, the order of the sum-of-products arithmetic unit 53 is 64, the attenuation is 40 dB, and the cut-off frequencies are 1525 MHz and 1575 MHz, the multiplication coefficients h0–hJ are set as shown in table 1, and the pass band characteristic is shown as a curve in FIG. 7. As shown in FIG. 7, the FIR band pass filter implemented by the arithmetic processing of the sum-of-products arithmetic unit 53 can remove the influence of aliasing from the multiphase sample signal, and can also remove the parts where there is a possibility that two reflected components or the signal component and the reflected component are overlapped with each other among all of the signal components of the input signal after frequency conversion. The multiplication coefficients are determined by, for example, defining a frequency response necessary for the sum-of-products arithmetic unit 53 to implement a filter with a desired pass band; determining an impulse response by inverted Fourier transforming the frequency response; and picking up part of the impulse response. At this time, if the above coefficients are made symmetric with the time zero being the center, the filter becomes of a so-called linear phase FIR.

TABLE 1

| | |
|---|---|
| h0 | = −0.00492251 |
| h1 | = 0.00598680 |
| h2 | = −0.00707584 |
| h3 | = 0.00815093 |
| h4 | = −0.00916799 |
| h5 | = 0.01007870 |
| h6 | = −0.01083191 |
| h7 | = 0.01137523 |
| h8 | = −0.01165686 |
| h9 | = 0.01162755 |
| h10 | = −0.01124259 |
| h11 | = 0.01046378 |
| h12 | = −0.00926132 |
| h13 | = 0.00761551 |
| h14 | = −0.00551817 |
| h15 | = 0.00297373 |
| h16 | = 0.00000000 |
| h17 | = −0.00337161 |
| h18 | = 0.00709626 |
| h19 | = −0.01111633 |
| h20 | = 0.01536259 |
| h21 | = −0.01975579 |
| h22 | = 0.02420863 |
| h23 | = −0.02862815 |
| h24 | = 0.03291831 |
| h25 | = −0.03698279 |
| h26 | = 0.04072789 |
| h27 | = −0.04406539 |
| h28 | = 0.04691526 |
| h29 | = −0.04920822 |
| h30 | = 0.05088792 |
| h31 | = −0.05191276 |
| h32 | = 0.05225725 |
| h33 | = −0.05191276 |
| h34 | = 0.05088792 |
| h35 | = −0.04920822 |
| h36 | = 0.04691526 |
| h37 | = −0.04406539 |
| h38 | = 0.04072789 |
| h39 | = −0.03698279 |
| h40 | = 0.03291831 |
| h41 | = −0.02862815 |
| h42 | = 0.02420863 |
| h43 | = −0.01975579 |
| h44 | = 0.01536259 |
| h45 | = −0.01111633 |
| h46 | = 0.00709626 |
| h47 | = −0.00337161 |
| h48 | = 0.00000000 |
| h49 | = 0.00297373 |
| h50 | = −0.00551817 |
| h51 | = 0.00761551 |
| h52 | = −0.00926132 |
| h53 | = 0.01046378 |
| h54 | = −0.01124259 |
| h55 | = 0.01162755 |
| h56 | = −0.01165686 |
| h57 | = 0.01137523 |
| h58 | = −0.01083191 |
| h59 | = 0.01007870 |
| h60 | = −0.00916799 |
| h61 | = 0.00815093 |
| h62 | = −0.00707584 |
| h63 | = 0.00598680 |
| h64 | = −0.00492251 |

Figure 8:
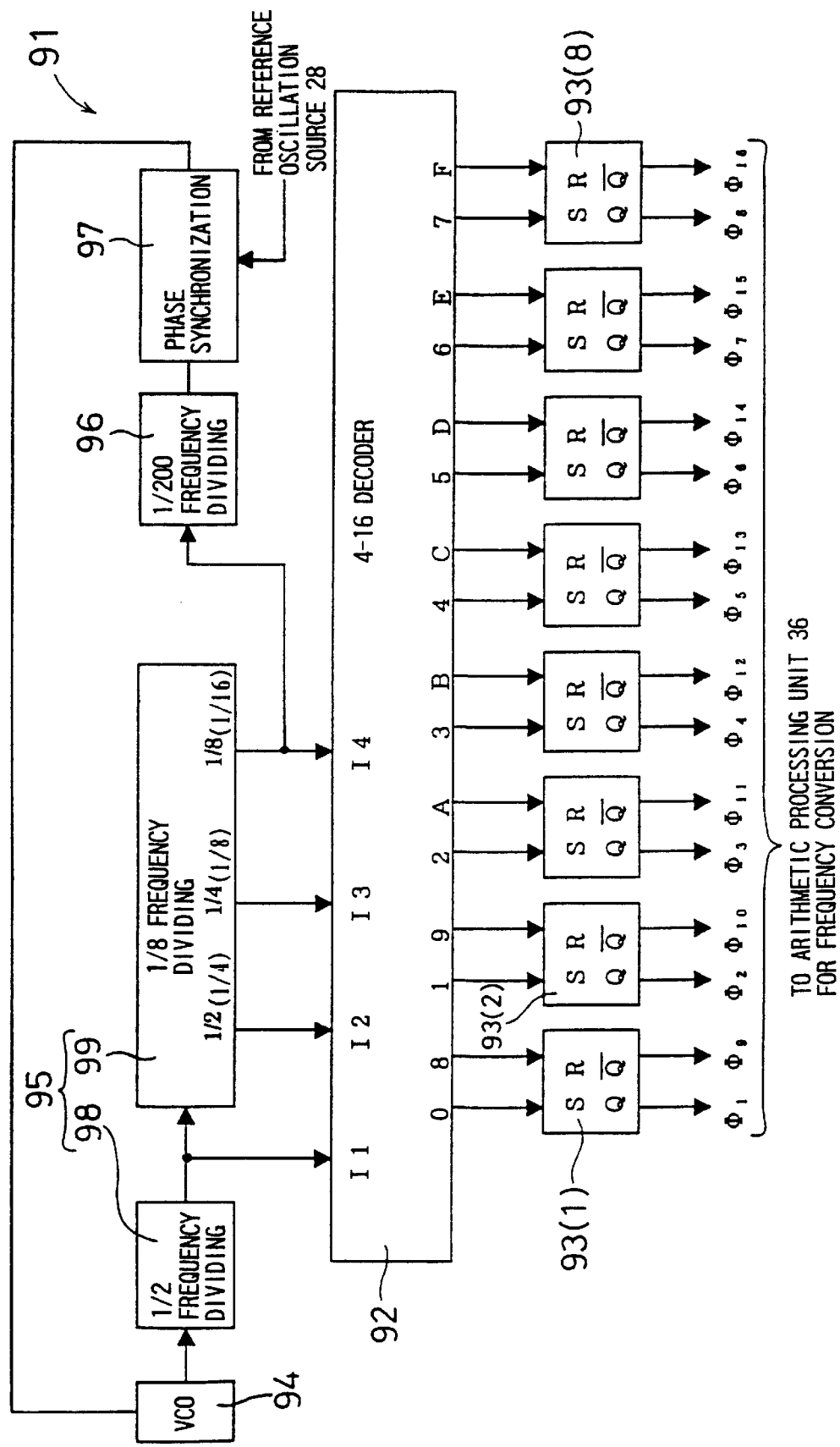
FIG. 8 is a block diagram showing a concrete configuration of a multiphase clock signal generator 37 in the signal processing unit 27 for frequency conversion.

FIG. 8 is a block diagram illustrating a concrete configuration of the multiphase clock signal generator. Referring to FIG. 8, the operation of the multiphase clock signal generator 37 is described in detail. In FIG. 8, the number N of clock signals is 16, the clock frequency fc is 200 MHz, and the oscillation frequency of the reference oscillation source 28 is one MHz.

The multiphase clock signal generator 37 includes a PLL (phase-locked loop) frequency synthesizer 91, a decoder 92 and RS type flip-flops (hereinafter abbreviated as RSFF) 93(1)–93(N/2), the number N/2 of which being a half of the number N of the clock signals. The PLL frequency synthesizer includes a voltage controlled oscillator (hereinafter abbreviated as VCO) 94, a first and a second frequency dividing units 95, 96 and a phase synchronizing unit 97.

The VCO 94 oscillates an initial oscillation signal of a frequency responsive to the voltage of the control signal which will be described later. The frequency of the initial oscillation signal is basically N times the clock frequency fc, and in FIG. 8 is 3200 MHz. The first frequency dividing unit 95 divides the frequency of the initial oscillation signal by N so as to generate a first frequency dividing signal of which frequency is one-Nth of the frequency of the initial oscillation signal. The first frequency dividing signal is supplied from the first frequency dividing unit 95 to the second frequency dividing unit 96. The second frequency dividing unit 96 further divides the frequency of the first frequency dividing signal by XB so as to obtain a second frequency dividing signal of which frequency is approximately equal to the oscillation frequency of the reference oscillation source 28. Here XB is a ratio of the clock frequency fc to the oscillation frequency of the reference oscillation source 28, and is 200 in FIG. 8. The frequency of the resultant second frequency dividing signal is approximately equal to the local oscillation frequency and is 1 MHz in FIG. 8. The phase synchronizing unit 97 composed of a phase comparator and a loop filter, compares the phases of the second frequency dividing signal and the local oscillation signal from the reference oscillation source 28, generates a control signal of which level corresponds to the difference in phase of both signals to supply the control signal to the VCO 94. The VCO 94 finely adjusts the frequency and the phase of the initial oscillation signal in response to the level of the control signal.

In the course of dividing processing by the first frequency dividing unit 95, first to XDth intermediate frequency dividing signals having frequencies of $2^{-1}$ to $2^{-XD}$ times the frequency of the initial oscillation signal are obtained. XD is $\log_2 N$ and is 4 in FIG. 8. The first frequency dividing signal divides the frequency of the initial oscillation signal by two, thereby ensuring a duty ratio of signal of 50%. The phase of the second to XDth intermediate frequency dividing signals is equal to that of the first frequency dividing signal. Those second to XDth intermediate frequency dividing signals and the first frequency dividing signal are supplied to the decoder 92 as electrical signals representing each of bits I1–IXD of an input digital signal of XD bits. The decoder 92 converts the input digital signal of XD bits into an output digital signal of N bits.

The least significant bit to the N/2th bit within said output digital signal are respectively supplied to set input terminals of first to N/2th RSFFs 93(1) to 93(N/2), and the (N/2+1)th bit to the most significant bit within the output digital signal are supplied to the reset input terminals of the first to N/2th RSFFs 93(1)–93(N/2). As a result, from output terminals of the first to N/2th RSFFs 93(1)–93(N/2), first to N/2th clock signals $\phi_1$–$\phi_{N/2}$ are outputted, and from the inverted output terminals of the first to N/2th RSFFs 93(1)–93(N/2), (N/2+1)th to Nth clock signals $\phi_{N/2+1}$–$\phi_N$ are outputted.

Since the multiphase clock signal generator 37 is configured as described above, it is possible to output the N-phase clock signals with a duty ratio of 50% in a stable manner, and it is possible to make the phase of the N-phase clock signals synchronized with the phase of the reference oscillation source 28. Accordingly, the arithmetic processing unit 36 can operate synchronously with other components 25, 29–32 of the receiver 21.

Figure 9:
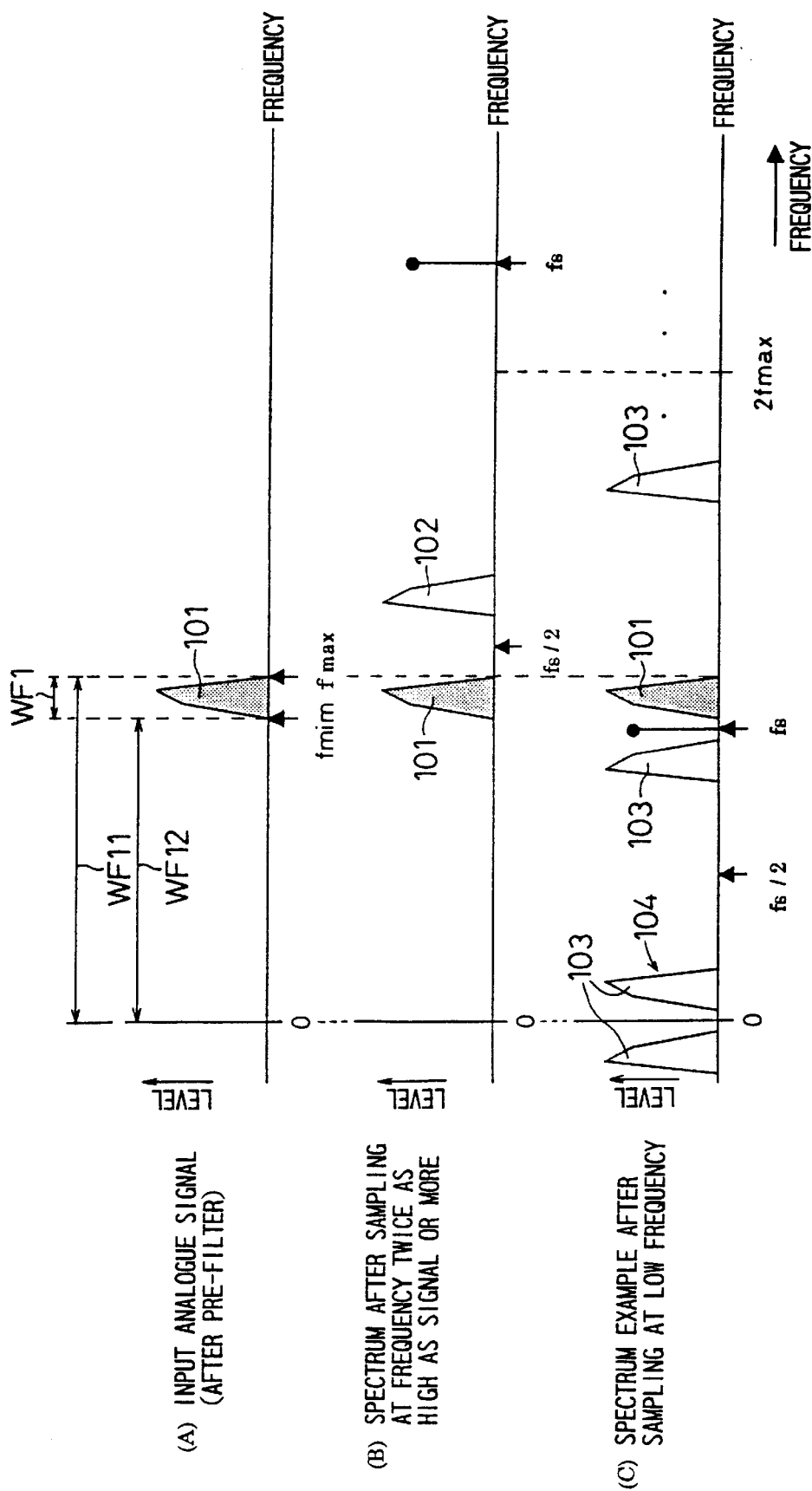
FIGS. 9(A)–9(C) show frequency spectrums illustrating a relationship between input signal, effective sampling frequency and operating frequency of the sum-of-products arithmetic unit 53.

FIG. 9 are the frequency spectrums showing relations between sampling frequency and frequency band in which reflected components are generated. Referring to FIG. 9, the condition that the operating frequency of the arithmetic processing unit 36 needs to satisfy will be described. FIG. 9(A) shows a frequency spectrum of an input analogue signal which is subjected to sampling in the following description. The input analogue signal corresponds to the input signal after passing the pre-filter 25, and includes only the components within the frequency band WF1 for telecommunications. A component within the frequency band WF1 for telecommunications is referred to as a desired component 101.

Now, it is assumed that the input analogue signal is sampled at the sampling frequency fs. In this case, the frequency spectrum of the resultant sample signal is such that a plurality of spectrum components having substantially the same shape with those within the frequency rage of not less than −fs/2 and not more than +fs/2 of the input analogue signal appear periodically at positions shifted from the original position by an integral multiple of the sampling frequency fs. Here "fs/2" is an absolute value of half the frequency of the sampling frequency fs. As a result, the above sample signal includes, in addition to the desired component, reflected components of the desired component. Since the spectrums of the desired component and the reflected components thereof are approximately equal with each other, a signal obtained by extracting any one of the reflected components from the sample signal results in a frequency-converted signal of the input analogue signal.

In general, to prevent the spectra of the reflected components and the spectrum of the desired component from overlapping with each other, the sampling frequency fs is often set at a frequency of equal to or higher than twice the maximum frequency fmax of the desired component. FIG. 9(B) shows a frequency spectrum of a sample signal which is obtained when the sampling frequency fs is twice as high as the maximum frequency fmax of the desired component or more. In this case, within the frequency band starting from 0 Hz or more, the lowest frequency of the reflected component 102 is always higher than the maximum frequency of the desired component 101 Consequently, the desired component 101 and the reflected component 102 will not overlap with each other, so that no distortion is caused due to overlap of the signal waveforms of both the components 101 and 102. Therefore, it is preferable that the effective sampling frequency fa of the multiphase sampling unit 52 is twice as high as the maximum frequency of the desired component or more. For this reason, it is also preferable that the filter processing of the sum-of-products arithmetic unit 53 is designed on the assumption that the sum-of-products arithmetic unit 53 operates at an operating frequency equal to or more than said frequency twice as high as the maximum frequency. In this way, it is possible to prevent the desired component the input signal after sampling processing and said filter processing in the multiphase sampling unit 52 from being affected by the reflected components in advance.

FIG. 9 is referred to again. The desired component 101 of the input analogue signal is included only in part of a frequency band WF11 spanning 0 to the maximum frequency fmax of the desired component 101, that is, only in the frequency band WF1 for telecommunications. Hence, the remaining band WF12 other than the desired input component WF1 in the frequency band WF11, that is, the band WF12 spanning 0 to the lowest frequency fmin of the desired component does not include any components which are necessary for processing. Therefore, the sampling frequency fs is selected so that the reflected components are included in the remaining band WF12, whereby it is possible to prevent the desired component and the reflected components from being distorted due to the overlap therebetween even when the sampling frequency fs is twice the maximum frequency fmax of the desired component 101 or less.

FIG. 9(C) shows a frequency spectrum of a sample signal obtained when the sampling frequency fs is twice the maximum sampling frequency fmax of the desired component or less, and the sampling frequency is selected so that the reflected components won't overlap with the desired component. In this case, at least one reflected component 103 is generated within the remaining band WF12, and each of the reflected component 103 is not overlapped with the desired component 101. As a result, a signal component of which maximum and minimum frequencies are lower than those of the desired component 101 and of which spectrum is almost the same as that of the desired component 101, that is, a signal component acquired by frequency conversion to lower the frequency of the desired component 101 appears as the reflected component 103. Accordingly, the signal obtained by extracting only any one of the reflected components 103 within the remaining band WF12 from the sample signal is equal to that acquired by frequency conversion to lower the frequency of the input analogue signal.

As described above, in the case where the frequency spectrum of the input analogue signal occupies only a part of the band WF11, the input analogue signal after filter processing is sampled at a sampling frequency of less than twice the maximum frequency fmax of the desired component 101 within the input analogue signal, and any one of the reflected components within the remaining band WF12 is extracted from the sampling result, whereby frequency conversion of the input analogue signal can be accomplished. That is to say, if the decimation processing is made equivalent to the sampling processing at a sampling frequency of less than twice the maximum frequency fmax as described above, that is, if the frequency of clock signal which defines the actual operating frequency of the sum-of-products arithmetic unit 53 is less than twice the maximum frequency fmax as described above, it is possible to convert the frequency of the input analogue signal to be lower than the original frequency. On the contrary, if the decimation processing is made equivalent to the sampling processing at a sampling frequency of twice the maximum frequency fmax or more as described above, that is, if interpolation processing is performed, it is possible to convert the frequency of the input analogue signal to be higher the original frequency.

In addition, the sampling frequency fs of the sampling processing which is equivalent to the decimation processing is preferably selected so that reflected components will not overlap the desired component in the sample signal obtained as a result of the sampling at the sampling frequency fs. This is intended to prevent the reflected component to be extracted from being distorted due to overlap to be extracted is prevented from being distorted due to overlapping with the desired component or other reflected components, and to makes the filter processing easy. Furthermore, in the case where a plurality of reflected components exist within the remaining band WF12, it is preferable to extract any one of the reflected component spanning the lowest frequency band. This is because the lower the maximum and the minimum frequencies of the extracted reflected component are, the more processing speed required for the processing using the extracted reflected component, e.g. processing in the channel selection processing unit 29 of the receiver in FIG. 1 can be reduced.

Therefore, in the receiver 21, after sampling the input signal including the component between 1.5 and 1.6 GHz at an effective sampling frequency of 3200 MHz, the sum-of-products arithmetic unit 53 of the arithmetic processing unit 36 for frequency conversion performs arithmetic processing on the result of the sampling processing at an operating frequency of 200 MHz, then the channel selection processing unit 29 extracts only the components within the band of 0–100 MHz from the receive signal after frequency conversion which is a result of the arithmetic processing, thereby accomplishing frequency conversion of the input signal. The above describes the operating frequency of the arithmetic processing unit 36.

The receiver 21 according to the first embodiment is provided with the pre-filter 25 as a filter for removing the components outside the frequency band for telecommunications in the input signal and the digital filter implemented by the sum-of-products arithmetic unit 53 within the signal processing unit 27. The pre-filter 25 is, as described above, an analogue filter embodied by a dielectric material or ceramic material. In the case where the analogue filter and the digital filter remove the signal components within the same band, it is preferable that the passband characteristics of the digital filter is as steep as possible. This is because it is difficult to design the passband characteristics of the analogue filter to be steep, though the passband characteristics of the digital filter is easily made steep only by increasing the order of the sum-of-products arithmetic. Therefore, in the case where a filter for removing signal components of a certain single band is configured in such a manner that the pre-filter 25 and the digital filter are arranged in this order, by designing the passband characteristics of the digital filter to be very steep, the passband characteristics of the pre-filter 25 may be kept gentle. As a result, it becomes possible to readily design and produce the pre-filter 25 and to improve the productivity, so that production cost for the receiver 25 can be reduced.

In the case where the receiver 21 is used in the communication network of TDMA (Time Division Multiple Access) system, the control unit 34 preferably controls the multiphase clock generating unit 37 as described in the following. The communication network of the TDMA system allocates a time band for receiving electromagnetic waves, with respect to each of a plurality of receivers. The base band signal to be transmitted to each of the receivers is modulated, or modulated and transmitted only within the time band allocated to said receiver. Accordingly, any one of the receivers 21 receives electromagnetic waves only within the time band allocated to the receiver 21, and need not to receive electromagnetic waves in the remaining time. Therefore, the control unit 34 always determines whether or not the present point is within the time band allocated to receive electromagnetic waves, and only in the allocated time band, causes the multiphase clock signal generator 37 to generate the clock signals $\phi 1$–$\phi N$, and causes the multiphase clock signal generator 37 to stop in the remaining time band. As a result, the arithmetic processing unit 36 is supplied with the N-phase clock signals only in the allocated time band. Therefore, the arithmetic processing unit 36 performs a variety of processings for frequency conversion only while the N-phase clock signals are supplied, and stops the processings in the remaining time band.

When the multiphase clock generating unit 37 is controlled in this way, the signal processing unit 27 operates only in the allocated time band, so that it is possible to further suppress the power consumption. Furthermore, since the units 29–31 following the signal processing unit 27 within the receiver 21 cooperate with the signal processing unit 27, these units 29–31 operate only when the signal processing unit 27 operates and halt in the remaining time band, with the result that it is possible to further suppress the power consumption. Consequently, when the receiver 21 is used as a receiver in the communication network of the TDMA system, it is possible to reduce the power consumption by controlling whether or not the N-phase clock signals are generated. Not limited to the case where the receiver is used the communication network of the TDMA system, but also in the case where there is a time period in which the receiver 21 need not to receive electromagnetic waves, the multiphase clock signal generator 37 is halted in said time period, so that it is possible to reduce the power consumption of the receiver 21.

Additionally, in the receiver 21, it is preferable to place a so-called buffer amplifier in the previous stage of every sampling circuit 54 of the multiphase sampling unit 51 and to input the input signal to every sampling circuit 54 through the buffer amplifiers. This is because of the following reasons: the input signal after amplification is supplied to all of the sampling circuits 54 at the same time, and in response to that, a plurality of sampling circuits 54 operates almost at the same time, which generate a noise due to the operation in the sampling circuits 54; the noise generated in any sampling circuit 54(n) passes through the configuration to supply the input signal to all of the sampling circuits 54, travels to the other sampling circuits or other parts within the receiver 21 and interfere the operation of the other sampling circuits or that other parts; since the input signal is supplied to all of the sampling circuits 54 at the same time, the capacity of the part relating to input of each sampling circuit is added to the input signal in parallel; and when the frequency of the input signal increases, processing of the input signal is effected by said capacity, which makes it difficult for the sampling circuit to respond to the high frequency. In order to remove the effect of the above described noise and capacity, it is preferable to place the buffer amplifier in the previous stage of every sampling circuit 54(n).

The receiver according to a second embodiment of the invention will be described below. The receiver according to the second embodiment, in comparison with the receiver 21 of the first embodiment, differs only in the signal processing unit for frequency conversion partially replaced with the one described below, and is same in the rest parts. Therefore, the configuration and the operation of the receiver of the second embodiment are omitted in the description for the parts those are equal to the receiver 21 of the first embodiment.

The multiphase clock generating unit within the signal processing unit generates only part of the N-phase clock signals, or the clock signals $\phi 1$ to $\phi K$. Herein, K is an integer which is one or more and less than N, and is 6 in the embodiment. The configuration of the multiphase clock generating unit is, for example, equal to that of the multiphase clock generating unit 37 of the first embodiment from which the parts used only for generation of the remaining clock signals $\phi K+1$ to $\phi N$ other than the partial clock signals 100 $1$–$\phi K$ are omitted.

Figure 10:
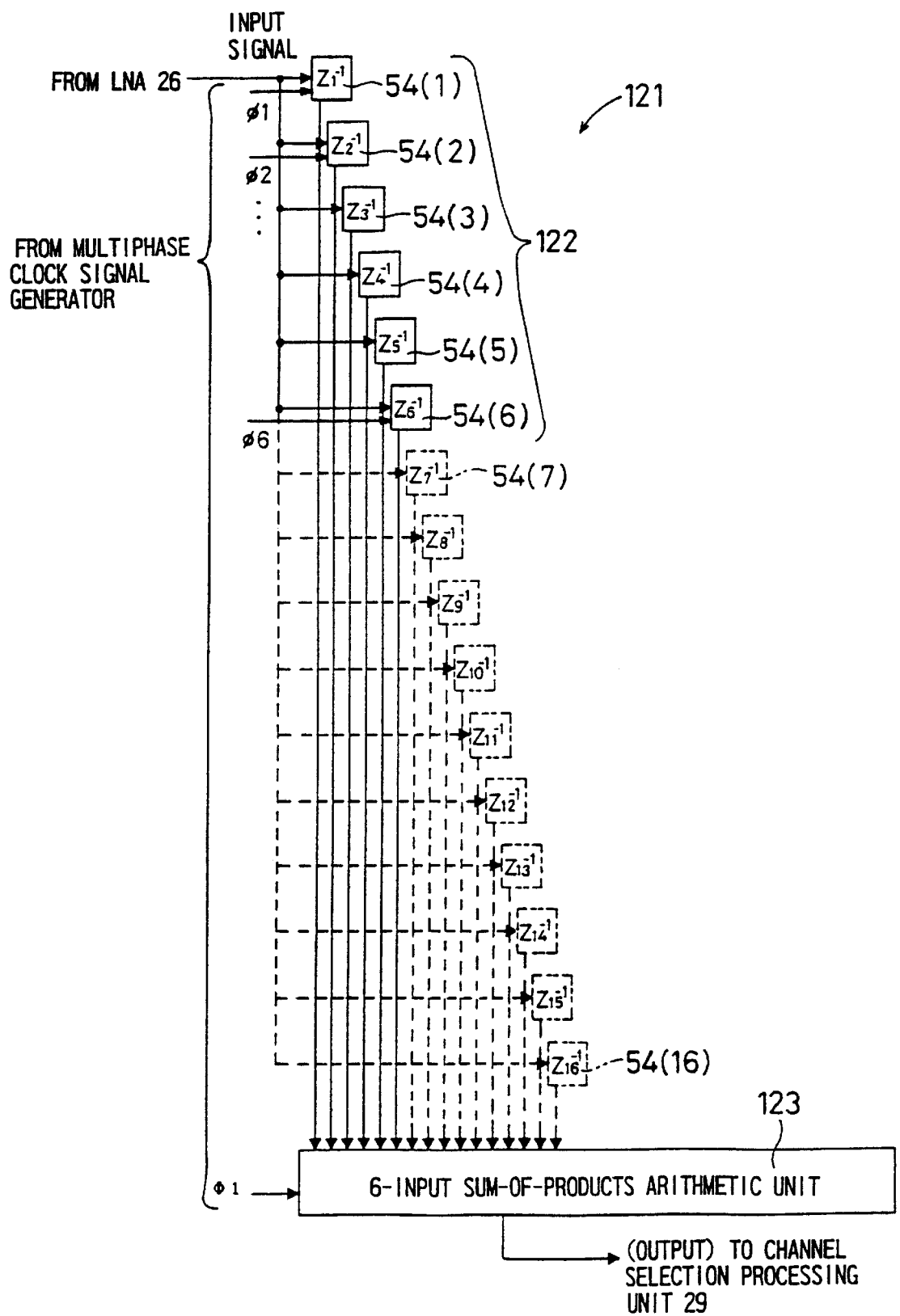
FIG. 10 is a block diagram showing a concrete electrical configuration of an arithmetic processing unit 121 of a signal processing unit for frequency conversion in a receiver which is the second embodiment of the invention.

FIG. 10 shows a block diagram illustrating an electrical configuration of a arithmetic processing unit 121 within the signal processing unit of the second embodiment. In the arithmetic processing unit of the second embodiment, the same parts as in the arithmetic processing unit 36 of the first embodiment are denoted by the same reference numerals and the descriptions thereof are omitted. The arithmetic processing unit 121 includes only a multiphase sample unit 122 and a sum-of-products arithmetic unit 123 of which tap number is 6. The tap number is the number of the input terminals, and is larger than the order L by one. The multiphase sample unit 122 includes sampling circuits 54(1) to 54(K) of which number is equal to the number K of the partial signals φ1 to φK.

Each of the partial signals φ1 to φK is supplied to each of the sampling circuits 54(1) to 54(K), respectively. The above-mentioned input signal after amplification is supplied to all of the sampling circuits 54(1) to 54(K), respectively, in parallel from the low noise amplifier 26 as an input signal to the arithmetic processing unit 36. Each of the sampling circuits 54(n) samples the input signal with the timing based on the supplied clock signal φn, and supplies a sample signal representing the sampling result to the sum-of-products arithmetic unit 53. The K sample signals obtained at all of the sampling circuits 54(1)–54(K), respectively, are aligned to constitute the above-mentioned multiphase sample signal. The effective sampling frequency fa of the multiphase sample unit 122 is N times the clock frequency fc.

The sum-of-products arithmetic unit 123 is equipped with input terminals corresponding to all of the sampling circuits 54(1) to 54(K) within the multiphase sample unit 122, respectively, and the sample signal from each of the sampling circuits 54(n) is supplied to the corresponding input terminal, respectively. The multiphase clock signal generator supplies the sum-of-products arithmetic unit 123 with any one of the partial clock signals φ1 to φK such as the first clock signal φ1. Consequently, the sum-of-products arithmetic unit 123 performs the sum-of-products arithmetic for filter processing every timing defined based on the supplied clock signal φ1. The number of sample signals required in the expression of the sum-of-products arithmetic is equal to the number of the input terminals. Therefore, for the sum-of-products arithmetic, only the sample signals from the K sampling circuits 54(1)–54(K) are used.

The configuration of the arithmetic processing unit 121 according to the second embodiment is equal to the configuration where the (K+1)th to Nth sampling circuits 54(K+1) to 54(n) and the matrix memory unit 52 within the multiphase sample unit are omitted from the arithmetic processing unit 36 according to the first embodiment. This is because of the following reasons.

In the arithmetic processing unit 121, the number of the multiphase samples and the decimation number are equal. The number of the multiphase samples means the number of sample signals supposed to be obtained during a single clock period Tc, when the input signal is actually sampled at the effective sampling frequency fa. Therefore, the filter arithmetic position with respect to all of the sample signals supplied during one period of the clock signal φ1 is always the same. That is to say, the relationship between each of the variables within the arithmetic expression and the sampling circuit which outputs a sample signal to be substituted for the variable is always the same. As a result, in all of the sampling circuits 54 of the multiphase sampling unit 151 according to the first embodiment, sample signals from the remaining sampling circuits other than the sampling circuits suppose to output the sample signals to be substituted for the variables are no longer used for the sum-of-products arithmetic. Therefore, the remaining sampling circuits can be omitted without giving any effects on the sum-of-products arithmetic. The above described relationship between the number of multiphase samples and the decimation number is established, in general, in the case where the frequency of the signal after decimation processing is the same as the clock frequency supplied to the multiphase sampling unit 51 or an integral division of the clock frequency.

In the embodiment, the arithmetic expression of the sum-of-products arithmetic corresponds to the first to Kth terms in the expression resulted from expansion of the expression of the sum-of-products arithmetic of the sum-of-products arithmetic unit 53 according to the first embodiment, i.e. Expression 1. Therefore, it is possible to omit the (K+1)th to Nth sampling circuits 54(K+1) to 54(N) and the matrix memory unit 52 in the arithmetic processing unit 36 according to the first embodiment. Furthermore, the K+1th to Nth clock signals $\phi_{K+1}$ to $\phi_N$ are used only for the K+1th to Nth sampling circuits 54(K+1) to 54(N) and the column memories in the next stages thereof. In the case where the K+1th to Nth sampling circuits 54(K+1) to 54(N) and the matrix memory unit 52 are omitted, those clock signals $\phi_{K+1}$–$\phi_N$ are also unnecessary, so that it is possible to omit the configuration for generating those clock signals $\phi_{K+1}$–$\phi_N$. Because of the above reasons, the arithmetic processing unit 121 according to the second embodiment has the configuration described above.

The arithmetic processing unit 121 according to the second embodiment has thus a simpler configuration than the integrated circuit of the arithmetic processing unit 36 according to the first embodiment. This makes integration of the arithmetic processing unit 121 of the second embodiment easier. Owing to the integrated circuit of the arithmetic processing unit 121 achieved as a result of integration, it is easy to reduce the size and production costs. Moreover, such an integrated circuit is simplified in the configuration, so that it is possible to make the current consumed in the operation smaller than that of the arithmetic processing unit 36 according to the first embodiment. And the multiphase clock generating unit according to the second embodiment is simpler in configuration than the multiphase clock generating unit 37 according to the first embodiment.

The arithmetic unit performing the decimation processing and the filter processing may be implemented by an finite impulse response (FIR) filter of which part of arithmetic coefficients are zero, instead of the sum-of-products arithmetic unit whose tap number K is smaller than the ratio N of the effective sampling frequency of the multiphase sampling unit 121 to the clock frequency fc. The configuration of the arithmetic processing unit in this case is equal to the arithmetic processing unit 36 according to the first embodiment where the configuration for generating sample signals to be substituted for variables which are to be multiplied with the arithmetic coefficients of zero is omitted. As a result, the arithmetic processing unit has the same effect as that of the arithmetic processing unit 121 according to the second embodiment. An arithmetic expression for implementing the finite impulse response filter of which part of arithmetic coefficients are zero is empirically determined by experiments and the like.

Figure 11:
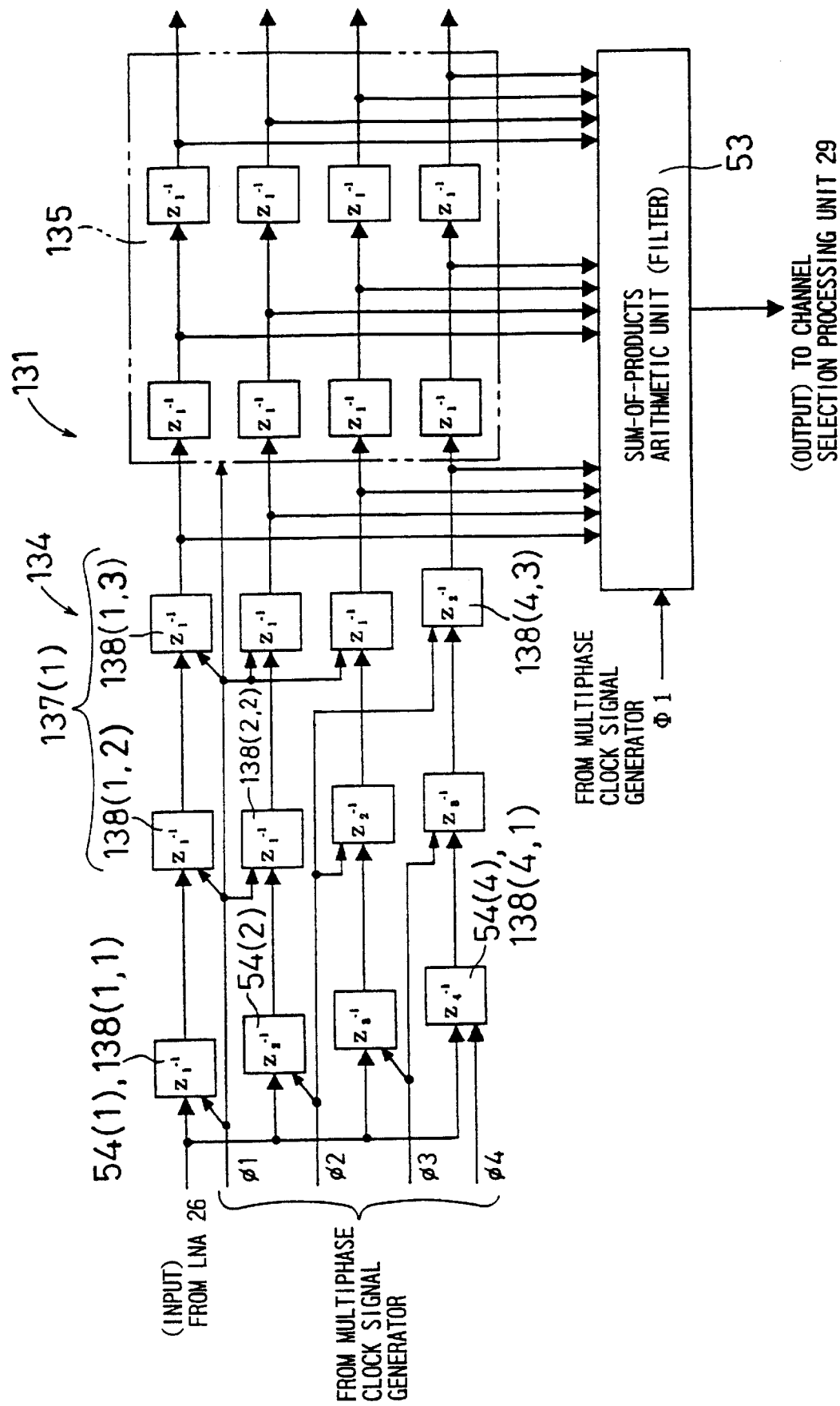
FIG. 11 is a block diagram showing a concrete electrical configuration of an arithmetic processing unit 131 of a signal processing unit for frequency conversion in a receiver which is the third embodiment of the invention.

A receiver according to the third embodiment of the invention will be described below. The receiver according to the third embodiment differs from the receiver 21 according to the first embodiment only in that the arithmetic processing unit for frequency conversion is replaced by what is described below, but equals in other respects. Therefore, in the configuration and the operation of the receiver according to the third embodiment, the equivalent parts with the receiver according to the first embodiment are denoted by the reference signs used in the first embodiment, and descriptions thereof are omitted. In FIG. 11, the number N is 4 and the order of the sum-of-products arithmetic unit 53 is 11.

FIG. 11 is a block diagram showing the electrical configuration of an arithmetic processing unit 131. The arithmetic processing unit 131 includes the multiphase sampling unit 51, an output adjusting unit 134 and a matrix memory unit 135. The multiphase sampling unit 51 includes N memory elements 54(1) to 54(N), which will be referred to as "138(1,1)" to "138(N,1)" for the following explanation. The output adjusting unit 134 includes n re-sample units 137(1) to 137(N). Each of the re-sample units 137(n) includes one memory element or a plurality of memory elements 138(n,2)–138(n,N–1) connected in a column. The matrix memory unit 135 differs from the matrix memory unit 52 of the first embodiment only in that a single clock signal of which phase is most delayed in all of the clock signals, i.e., the first clock signal φ1 is supplied to every memory element, but equals in other respects. Each of the re-sample units 137(n) is connected to the next stage of each sampling circuit 54(n), respectively. Each of the column memories 55(n) within the matrix memory unit 135 is connected to the next stage of each re-sample unit 137, respectively.

In all of the memory elements 138(n,2)–138(n,N–1) of each re-sample unit 137(n), to the memory element 138(n,2) in the front stage, the memory element 138(n,2) of the first stage is supplied with a clock signal $\phi_{n-1}$ of which phase is delayed by N–1/N of 2π than that of the nth clock signal $\phi_n$ supplied to the sampling circuit 54(n) in the previous stage of the re-sample unit 137(n). In all of the memory elements 138(n,2)–138(n,N–1) of each re-sample unit 137(n), each of the second to n=1th memory elements 138(n,k) is supplied with a clock signal $\phi_{k-2}$ of which phase is delayed by N–1/N of 2π than the clock signal $\phi_{k-1}$ supplied to the memory element (n,k–1) of the previous stage of each memory element 138(n,k). In all of the memory elements 138(n,1) to 138(n,N–1) of each re-sample unit 137(n), each of the memory element 138(n,k) of the nth to the last stages is supplied with any one clock signal which is equal to that supplied to the matrix memory unit 135, respectively. In this embodiment, the first clock signal $\phi_1$ is used as described above.

The input signal after amplification is supplied in parallel to every sampling circuits 54(1) to 54(N) within the multiphase sampling unit 51 from the low noise amplification unit 26. Each sampling circuit 54(n) samples the input signal with the timing based on the supplied clock signal φn, and causes the memory element in the first stage of the re-sample unit 137(n) which follows the sampling circuit 54(n) to memorize the resultant sample signal.

Each of the memory elements 138(n,2) to 138(n,N–2) of the first to the last two stages within each re-sample unit 137(n) supplies the sample signal memorized at that point of time to the memory elements 138(n,3) to 138(n,N–1) in the next stages of each memory element with the timing based on the supplied clock signal, erases the sample signal, and samples the sample signal from the sampling circuit 54(n) or the memory elements 138(n,1) to 138(n,N–3) in the previous stage of each memory element to memorize it. The memory element 138(n,N–1) in the last stage of each re-sample unit 137(n) supplies the sample signal memorized at that point to the sum-of-products arithmetic unit 53 and the memory element in the first stage of the matrix memory 135(n) following each re-sample unit 137(n) with the timing based on the supplied clock signal, erases that sample signal, and samples the sample signal from the memory element 138(n,N–2) in the previous stage of each memory element to memorize it.

The operation of each memory element within the matrix memory unit 135 in comparison with the operation of each memory element within the matrix memory unit 52 of the first embodiment, differs only in that the first clock signal φ1 is used for the timing control of the operation and is the same in other respects. The sum-of-products arithmetic unit 53 performs the sum-of-products arithmetic for filter processing with the timing based on the first clock signal, and supplies the arithmetic result to the channel selection processing unit 29.

Through the above procedure, the first to Nth re-sample units 137(1)–137(N) within the output adjusting unit 134 output all of the sample signals which are inputted in response to the first to Nth clock signals $\phi_1$–$\phi_N$ synchronously with the first clock signal. Therefore, all of the memory elements in the matrix memory unit 135 output the sample signals at the same time synchronized with the first clock signal. Consequently, only the first clock signal φ1 is used as all of the clock signals for controlling the operations of the matrix memory unit 135 and the sum-of-products arithmetic unit 53.

Since the clock signals are supplied as described above, each memory element 138(n,m) within each re-sample unit 137(n) performs sampling before one period of a clock signal supplied to the memory element 138(n,m) in the previous stage of the memory element 138(n,m) has elapsed from the moment that the previous memory element 138(n, m–1) outputs the sample signal. In this case, the clock signal supplied to each memory element 138(n,m) is delayed by (N–1)/N of 2π in phase from the clock signal supplied to the memory element 138(n,m–1) in the previous stage of each memory element 138(n,m). Such being the case, each memory element 138(n,m) needs to operate with the period of (N–1)/N of the clock period Tc. Therefore, in order for each re-sample unit 137(n) to output a sample signal without any trouble, the maximum clock frequency fcmax should be the frequency which is (N–1)/N times of the maximum operating frequency fmax of the circuit element constructing the arithmetic processing unit 131 as shown in Expression 2. Therefore, the substantially maximum sampling frequency FBmax in the processing unit comprising the multiphase sample unit 51 and the output adjusting unit 134 is N–1 times the maximum operating frequency fmax, as shown in Expression 3.

$$f\text{cmax}=(N-1)\div N \quad (2)$$

$$FB\text{max}=(N-1)\div N\times N=N-1 \quad (3)$$

The memory element 138(N,N–1) in the last stage of the Nth re-sample unit 137(N) outputs a sample signal to the sum-of-products arithmetic unit 53 with the timing based on the clock signal φ2 of which phase is delayed by 2π/N than that of the first clock signal φ1. This is because of the following reasons. Since the memory element within the matrix memory unit 135 operates synchronously with the first clock signal φ1, the phase difference between the clock signals φ2 and φ1 which are supplied to the memory element 138(N,N–1) and said memory element within the matrix memory unit 135 is one-Nth of 2π. Therefore, the relationship of operating period between the memory element 138(N,N–1) and the memory element within the matrix memory unit 135 is equal to the relationship of operating period between arbitrary two memory elements 138(n,m) and 138(n,m+1) connected in a column within the nth re-sample unit 137(n). Accordingly, even though the memory element 138(N, N–1) in the last stage operates in response to the clock signal φ2, the clock frequency fc can be maintained at N–1/N times the maximum operating frequency fmax of the circuit element. Also, following the memory element 138(n,N–1) in the last stage of each re-sample unit 137(n), a memory element 138(n,N) to which the first clock signal is supplied may be added. As a result, all of the re-sample units 137(1)–137(N) can output the clock signals at the same time.

A receiver according to the fourth embodiment of the invention will be described below. The receiver according to the fourth embodiment, in comparison with the receiver 21 according to the first embodiment, differs in that the arithmetic processing unit for frequency conversion is replaced by what will be described below, but equals in other respects. Therefore, in the configuration and the operation of the receiver according to the fourth embodiment, the parts equivalent to those of the receiver according to the first embodiment are denoted by the same reference signs, and descriptions thereof are omitted. Additionally, in FIG. 12, the number N is 4, and the order LP of the sum-of-products arithmetic unit 53 is 8.

Figure 12:
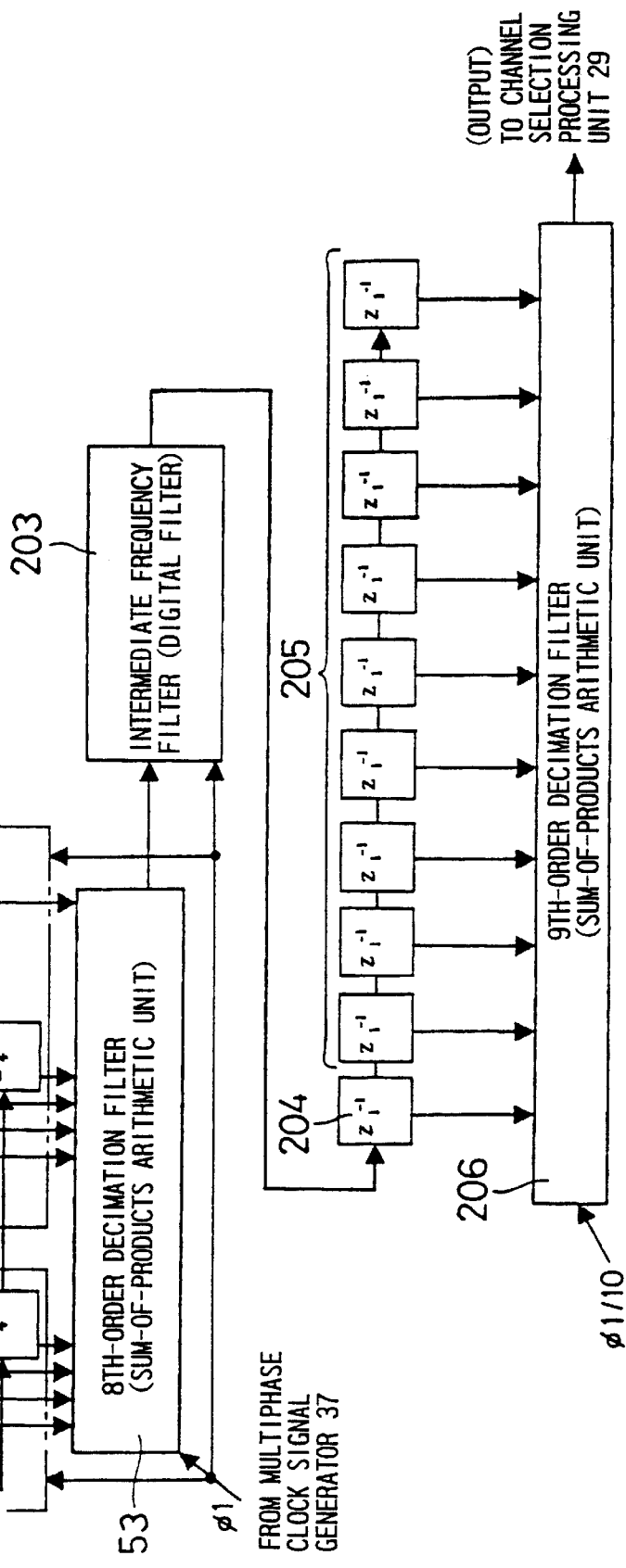
FIG. 12 is a block diagram showing a concrete electrical configuration of an arithmetic processing unit 201 of a signal processing unit for frequency conversion in a receiver which is the fourth embodiment of the invention.

FIG. 12 is a block diagram illustrating an electrical configuration of an arithmetic processing unit 201 for frequency conversion of the receiver according to the fourth embodiment. The arithmetic processing unit 201 has a general configuration in which two blocks having the same configuration as that of the arithmetic processing unit according to the first embodiment are connected in a column with an intermediate frequency filter 203 interposed therebetween. The arithmetic processing unit 201 concretely includes, in addition to the intermediate frequency filter 203, the first multiphase sampling unit 51, the first matrix memory unit 52, the first sum-of-products arithmetic unit 53 for decimation processing, a second multiphase sampling unit 204, a second matrix memory unit 205 and a second sum-of-products arithmetic unit 206 for decimation processing. The intermediate frequency filter 203 is implemented by a digital filter. The second multiphase sampling unit 204 and the second matrix memory unit 205 have essentially the same configuration and the same operation as the multiphase sampling unit 51 and the matrix memory unit 52 according to the first embodiment, and in the embodiment, includes one sampling circuit and one column memory.

To the intermediate frequency filter 203, the second multiphase sampling unit 204 and the second matrix memory unit 205, a clock signal the same as that supplied to the first sum-of-products arithmetic unit 53 such as the first clock signal $\phi$N is supplied from the multiphase clock signal generator 37 or other clock signal generators. And to the second sum-of-products arithmetic unit 205, a clock signal $\phi_{1/10}$ of which frequency is one-tenth of the frequency of the clock signal supplied to the first sum-of-products arithmetic unit 53 is supplied from the multiphase clock signal generator 37 or other clock signal generators. The receiver according to the fourth embodiment is a transmitter of a so-called double super heterodyne type.

The first sum-of-products arithmetic unit 53 outputs the signal after frequency conversion as described with referring to FIG. 4. The intermediate frequency filter 203 allows a passage of any one component within a predetermined frequency band among the plurality of reflected components 72 of which center frequency is lower than that of the signal component 71 within the frequency band for telecommunications in the signal after frequency conversion. As a result, a first intermediate frequency signal of which carrier frequency is a predetermined first intermediate frequency is outputted from the intermediate frequency filter 203 to the second multiphase sampling unit 204. The intermediate frequency filter 203 is provided because the frequency characteristics of the digital filter implemented by the second sum-of-products arithmetic unit 206 is too gentle to extract any one of the reflected components, and is designed so that the frequency characteristics is steeper than that of the digital filter.

The sampling circuit of the second multiphase sampling unit 204 samples the first intermediate frequency signal with the timing defined on the basis of the supplied clock signal $\phi$1, and supplies the resultant sample signal to the first memory element of the second matrix memory unit 205 and the second sum-of-products arithmetic unit 206. Each memory element within the second matrix memory unit 205 supplies a sample signal stored at that time to each of the memory element in the next stage and the second sum-of-products arithmetic unit 206, with the timing defined based on the supplied clock signal $\phi$1, erases the sample signal, and then memorize the sample signal supplied from the memory element in the previous stage. The second sum-of-products arithmetic unit 206 performs $\frac{1}{10}$ decimation processing on an assembly of the sample signals supplied from the second multiphase sampling unit 204 and the matrix memory unit 205, with the timing based on the supplied clock signal $\phi_{1/0}$. As a result, the second sum-of-products arithmetic unit 206 outputs a second intermediate frequency signal which is the signal after frequency conversion of the first intermediate frequency signal. For example, in the case where the signal component of the first intermediate frequency signal is within a frequency band of 0–100 MHz, the signal component is shifted within a frequency band of 0–10 MHz in the second intermediate frequency signal.

Through the above processings, the signal processing unit of the receiver according to the fourth embodiment has a configuration equivalent to the configuration of the so-called double super heterodyne system. Accordingly, the receiver having the above signal processing unit has advantages the same as the receiver employing the double super heterodyne system. In addition, it can be expected that the power consumption is reduced since the clock signal frequency for signal processing in the following stage becomes smaller and that inexpensive devices can be used.

Figure 13:
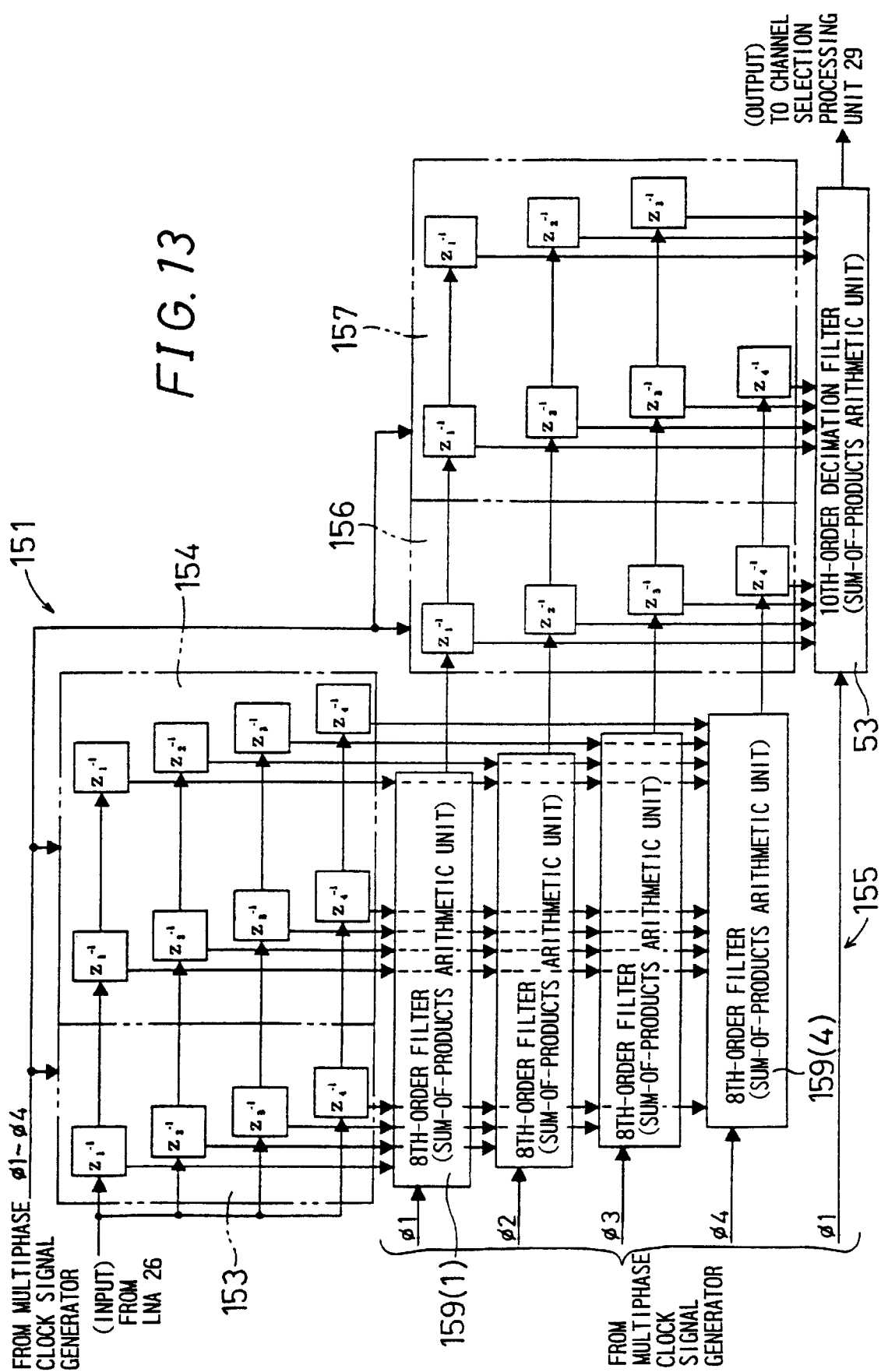
FIG. 13 is a block diagram showing a concrete electrical configuration of an arithmetic processing unit 151 of a signal processing unit frequency conversion in a receiver which is the fifth embodiment of the invention.

A receiver according to the fifth embodiment of the invention will be described below. The receiver according to the fifth embodiment, in comparison with the receiver 21 according to the first embodiment, differs in that the arithmetic processing unit for frequency conversion is replaced by what is described below, and is equal in other respects. In the configuration and the operation of the receiver according to the fifth embodiment, the same parts as the receiver according to the first embodiment are denoted by the same reference signs used in the first embodiment, and descriptions thereof are omitted. In FIG. 13, the number N is 4 and the order LB of the sum-of-products arithmetic unit 53 for decimation processing and filter processing is 10.

FIG. 13 is a block diagram illustrating an electrical configuration of an arithmetic processing unit 151 for frequency conversion of the receiver according to the fifth embodiment. The arithmetic processing unit 151 includes a primary multiphase sampling unit 153, a primary matrix memory unit 154, a parallel arithmetic filter unit 155 for primary filter processing, a secondary multiphase sampling unit 156, a secondary matrix memory unit 157 and the sum-of-products arithmetic unit 53 for secondary filter processing and decimation processing.

The configurations of the primary and the secondary multiphase sampling units 153 and 156 are the same as that of the multiphase sampling unit 51 according to the first embodiment. The configurations of the primary and the secondary matrix memory units 154 and 157 are the same as that of the matrix memory unit 52 according to the first embodiment. The parallel arithmetic filter unit 153 includes N sum-of-products arithmetic units 159(1)–159(N) of which order LA is mutually equal. In the embodiment, the order LA is 8. The number of memory elements of the primary matrix memory unit 154 is defined on the basis of the order of the sum-of-products arithmetic units 159(1)–159(N) within the parallel arithmetic filter unit 155 and the number of the sum-of-products arithmetic units 159(1)–159(N). The number of memory elements of the secondary matrix memory unit 157 is defined on the basis of the order LB of the sum-of-products arithmetic unit 53 for filter processing and decimation processing.

The input signal after amplification is supplied in parallel to every sampling circuit 54(1)–54(N) within the primary multiphase sampling unit 153 from the low noise amplifier 26. The nth clock signal φn is supplied to the nth sampling circuits 54(n) within the primary and the secondary sampling units 153 and 156, the nth sum-of-products arithmetic unit 159(n) within the parallel arithmetic filter unit 155, the nth column memories 55(n) within the primary and the secondary matrix memory units 154 and 157. And the sum-of-products arithmetic unit 53 for decimation filter is supplied with any one of all the clock signals φ1–φN such as the first clock signal φ1.

The operations of the primary multiphase sampling unit 156 and the primary matrix memory unit 157 are the same as those of the multiphase sampling unit 52 and the matrix memory unit 53 according to the first embodiment. Accordingly, XF sample signals are outputted from the primary multiphase sampling unit 133 and the primary matrix memory unit 154 during a lapse of a clock period Tc. XF is the sum of the value which is the order LA of each sum-of-products arithmetic unit 159 within the parallel arithmetic filter unit 155 plus one, and the value which is the number N of the sum-of-products arithmetic units 159 minus one. XF sample signals are aligned in the order of being sampled to form the primary multiphase sample signal.

Any of the nth sum-of-products arithmetic units 159(n) acquires LA+1 sample signals from the nth sample signal to the (n+LA)th sample signal within the primary multiphase sample signal with the timing based on the supplied clock signals n, and performs a predetermined arithmetic processing for primary filter processing using the acquired sample signals. The number n+LA is the sum of the order LA and n. Each of the sum-of-products arithmetic units 159(1)–159(N) uses the sample signals which are different from each other in location within the first multiphase sample signal for performing the above-mentioned processings, with the result that the parallel arithmetic filter unit 155 performs so-called convolution arithmetic on the first multiphase sample signal. Therefore, the parallel arithmetic filter unit 155can perform convolution arithmetic processing on the result of the processing by the primary sampling unit 133 while using the circuit part of which operating frequency is lower than the effective sampling frequency of the primary sampling unit 133.

The arithmetic results of the first to nth sum-of-products arithmetic units 159(1)–159(N) are supplied to the first to nth sampling circuits within the secondary multiphase sampling unit 156, respectively. The operations of the secondary multiphase sampling unit 156 and the matrix memory unit 157, in comparison with the multiphase sampling unit 52 and the matrix memory unit 53 according to the first embodiment, differs only in that a signal to be supplied to each sampling circuit is a result of arithmetic, and is the same in other respects. For this reason, while one clock period Tc elapses, sample signals of which number is by one larger than the order LB of the sum-of-products arithmetic unit 53 are supplied to the sum-of-products arithmetic unit 53 from the secondary multiphase sampling unit 136 and the secondary matrix memory unit 157. The sample signals of which number is by one larger than the order LB are aligned in the order of being sampled to form the secondary multiphase sample signal. The sum-of-products arithmetic unit 53 performs secondary filter processing on the secondary multiphase sample signal and decimation processing on the secondary multiphase sample signal after secondary filter processing.

The characteristics of the primary digital filter implemented by the primary filter processing and the characteristics of the secondary digital filter implemented by the secondary filter processing are appropriately set in accordance with, for example, the usage condition of the receiver. For example, the primary and the secondary digital filters may be a filter which removes signal components outside the frequency band for telecommunications from the input signal after amplification, or the primary digital filter may be a filter for removing the signal components outside the frequency band for telecommunications from the input signal after amplification and the secondary digital filter may be a filter for removing the signal components outside the designated channel. Furthermore, the primary or the secondary digital filter may be a removal filter for removing the components corresponding to the interference wave which interferes an electromagnetic wave from the transmitter, from the input signal after amplification. In the case where the first or the second digital filter is the removal filter, it is possible to readily improve the receiving performance of the receiver. This is because of the following reasons.

Among performances of a radio communication apparatus, as an indication to measure the ability of removing the effect of an interference wave against the desired electromagnetic wave transmitted from the transmitter, there are an image interference ratio and a spurious response, for example. The interference wave is such that a frequency fu of the interference wave has a special relationship between an intermediate frequency fIF, a frequency fr of the desired electromagnetic wave and the local oscillation frequency fo from the reference oscillator 28 as follows.

In the following description, the frequency fu of the interference wave is referred to as an interference frequency fu, and the frequency fr of the desired electromagnetic wave is referred to as a receive frequency fr. And, in the following description, it is assumed that in the case where the local oscillation frequency fo is lower than the receive frequency fr and the receiver is of the super heterodyne system, the second local oscillation frequency fo is lower than the first intermediate frequency fIF. In this case, as shown in Expression 4, the intermediate frequency fIF is equal to the difference obtained by subtracting the local oscillation frequency fo from the receive frequency fr.

$$fr-fo=fIF \qquad (4)$$

In a general super heterodyne receiver, the interference frequency fu is equal to a so-called image frequency and part of spurious responses. An image frequency fua is equal to the difference obtained by subtracting the frequency which is twice the intermediate frequency fIF from the receive frequency fr as expressed by the following Expression 5. There are a variety of types of spurious responses. For example, as expressed by Expression 6, a half IF response fub is equal to what is obtained by adding/subtracting the frequency which is half of the intermediate frequency fIF to/from the local oscillation frequency fo. As shown by Expression 7, generally, a one-nth IF response fuc is equal to what is obtained by adding/subtracting the frequency which is one nth of the intermediate frequency fIF to/from the local oscillation frequency fo. Among these spurious responses, the interference wave which will interfere with the intermediate frequency is that having a frequency fu of equal to the intermediate frequency fIF, as shown by FIG. 8.

$$fua=fr-2\times fIF \quad (5)$$

$$fub=fo\pm fIF\div 2 \quad (6)$$

$$fuc=fo\pm fIF\div n \quad (7)$$

$$fu=fIF \quad (8)$$

In the receiver of the invention, the interference frequency includes the frequencies of all of the reflected components 72 shown in the graph of FIG. 4 in addition to the above-mentioned frequencies. The frequencies of the reflected components within the frequency band WF2 between 0 Hz and 100 MHz corresponds to the intermediate frequency interference. The reflected component 102 shown in FIG. 9(B) and the reflected component 103 shown in FIG. 9(C) correspond to the above-mentioned image frequency. That is to say, those reflected components 72, 102, 103 correspond to the interference frequencies to be removed by the filter. The above describes the interference frequency.

In this case, the input signal includes a component corresponding to the desired electromagnetic wave and a component corresponding to the interference wave of the desired electromagnetic wave. The component corresponding to the interference wave overlaps with the component corresponding to the desired electromagnetic wave within the input signal through a processing for frequency conversion of the input signal. As a result, the component corresponding to the desired electromagnetic wave is influenced by the component corresponding to the interference wave. The interference wave thus has an effect on the component corresponding to the electromagnetic wave through the processing for frequency conversion, so that it is difficult to remove the interference wave after frequency conversion processing. Therefore, the component corresponding to the interference wave is removed from the input signal before the processing for frequency conversion, whereby the component is readily removed from the input signal to readily improve the receive performance of the receiver.

Since the interference wave has the relationship with the desired electromagnetic wave as described above, when the designated channel is changed to lead to a change in frequency of the electromagnetic wave to be received for the time being, also the interference frequency will be changed. Therefore, it is necessary to define the pass characteristics of the removal filter and the center frequency of the pass band in accordance with the enter frequency of the designated channel. Therefore, in the case where the first or second digital filter is used as the filter for removing the interference wave, arithmetic coefficients of arithmetic processing for implementing the filter are predefined individually f or the respective center frequencies of all the channels capable of being designated, or for each of plural groups resulted from grouping of all the channels capable of being designated. Whenever the designated channel is changed, the sum-of-products arithmetic unit for implementing the removal filter resets the arithmetic coefficient of the removal filter according to the designated channel after change. Since the first and the second digital filters are implemented by arithmetic processings, the pass characteristics of the removal filter and the center frequencies of the pass band may be changed by changing the arithmetic coefficient as described above. Therefore, the pass characteristics of the removal filter and the center frequency can be changed quite easily.

The removal of the interference wave may be performed only in the case there is an interference wave. Therefore, the receiver detects the existence of an interference wave in parallel with reception of electromagnetic waves, and only while there is an interference wave, the first or second digital filter may be operated as a filter for removing interference. A detector unit section for detecting the existence of the interference wave is, for example, realized by a structure which detects the AM components of the wave of the input signal. This is because of the following reasons. There arises a frequency difference between the desired electromagnetic wave and the interference wave inside the receiver because of the difference in oscillation frequency between the transmitter oscillating the desired electromagnetic wave and the transmitter oscillating the interference wave, and the relationships between the desired electromagnetic wave and the interference wave and the local oscillation frequency within the receiver. Due to this frequency difference, the input signal fluctuates in the amplitude. As a result, the detector unit detects an AM component in the input signal and determines the existence of the interference wave upon detection of AM components.

Figure 14:
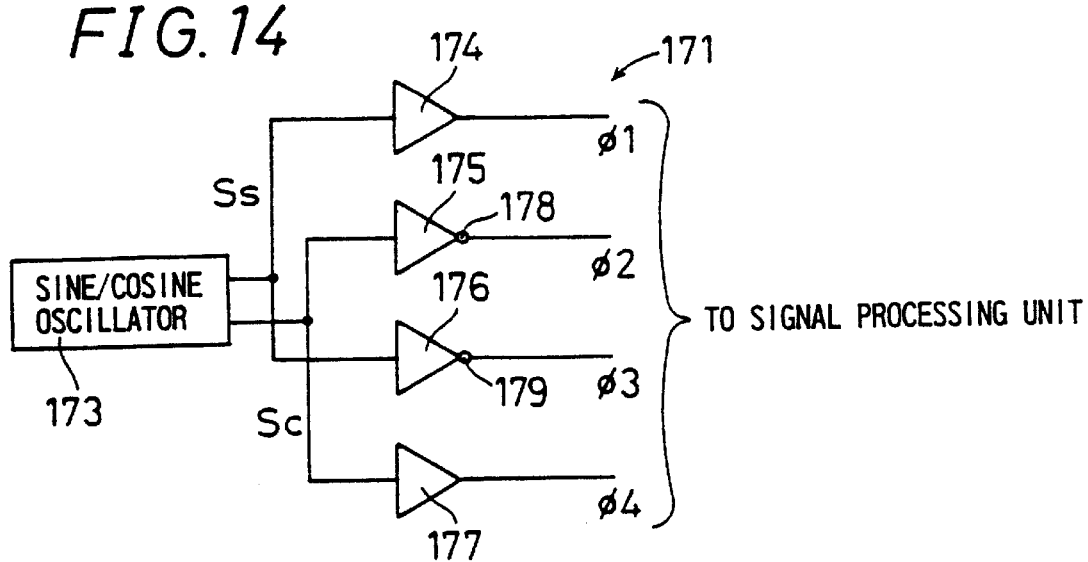
FIG. 14 is a block diagram showing an electrical configuration of a multiphase clock signal generator 171 that is used in the case where the number of clock signals N is 4 in the receivers of the first to fifth embodiments of the invention.
Figure 15:
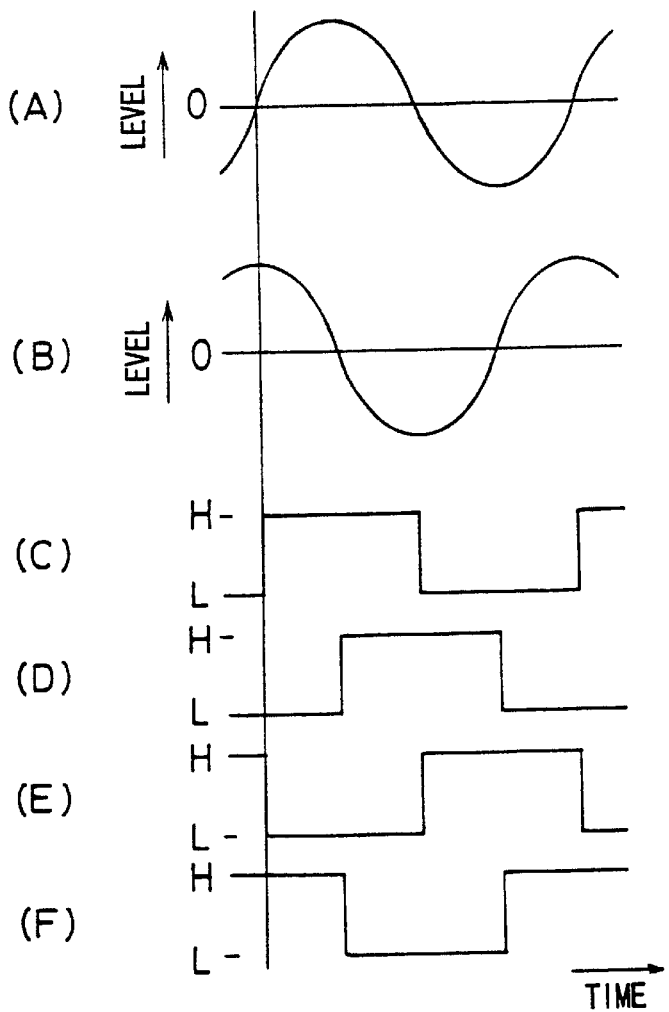
FIGS. 15(A)–15(F) are wave form charts of a sine wave signal Ss, a cosine signal Sc and first to fourth clock signals φ1–φ4 generated in the multiphase clock signal generator 171.
Figure 16:
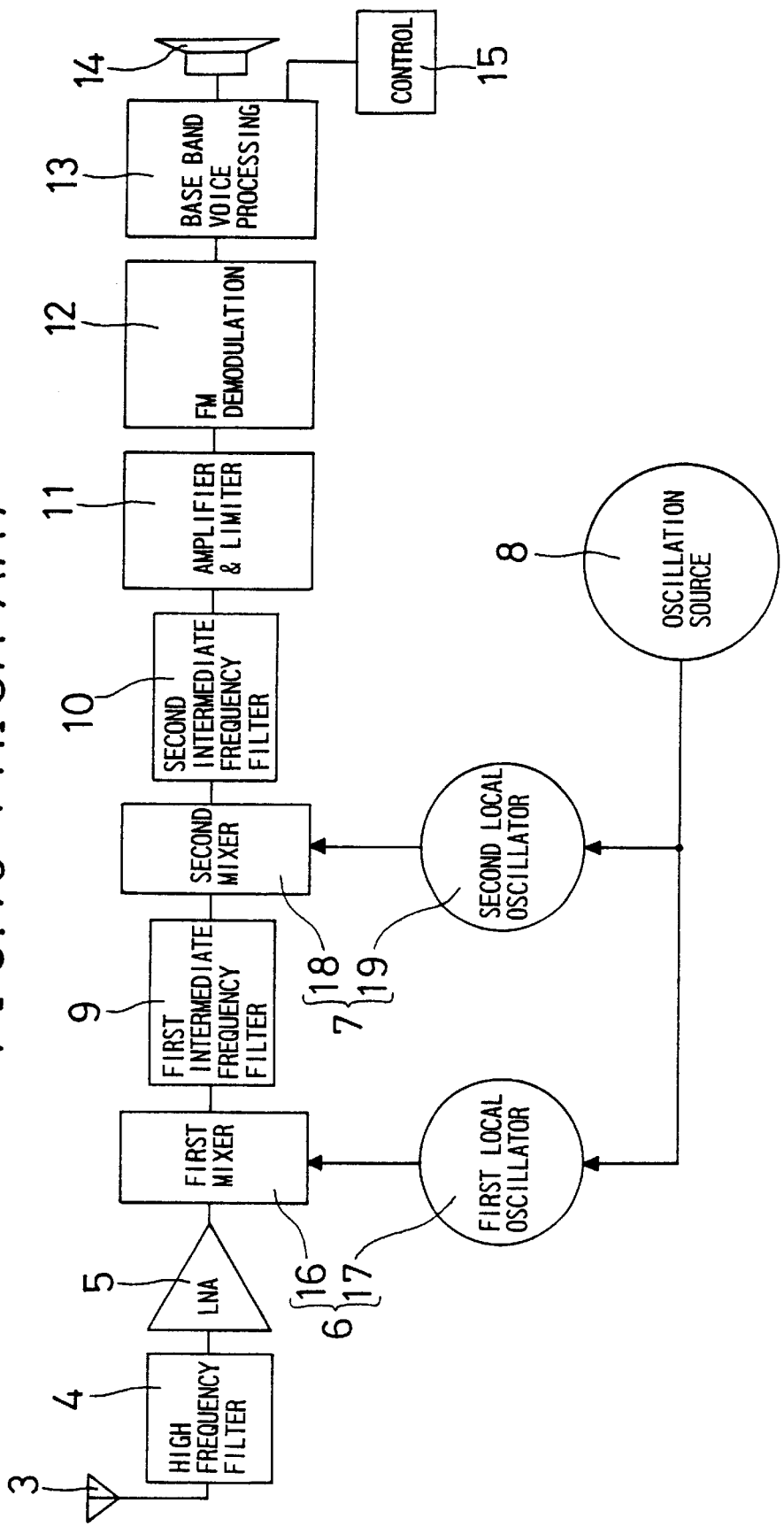
FIG. 16 is a block diagram showing a concrete electrical configuration of a receiver 1 according to a prior art.

In the receivers according to the first to fifth embodiments, it is preferable that the number N of the clock signals is 4. The reason for this will be described below by referring to FIG. 14 and FIG. 15. FIG. 14 is a block diagram illustrating an electrical configuration of a multiphase clock signal generator 171 for generating four-phase clock signals. The multiphase clock signal generator 171 includes a sine/cosine oscillator 173, first to fourth buffers 174 to 177 and first and second NOT circuits 178 and 179.

The sine/cosine oscillator 173 generates a sine wave signals Ss and a cosine wave signal Sc shown in FIG. 15(A) and FIG. 15(B). The signal waveform of the sine wave signal Ss is a sine wave, and the signal waveform of the cosine wave signal Sc is a cosine wave. The sine wave signal Ss and the cosine wave signal Sc are synchronized with each other and have the same frequency which is the clock frequency fc. The sine analogue signal Ss is supplied to the first and the third buffers 174 and 176, and the cosine analogue signal Sc is supplied to the second and the fourth buffers 175 and 177.

Each of the buffers 174–177 converts the supplied signal to a digital signal, respectively. The second and the third buffers 175 and 176 supply the first and the second NOT circuits with the sine and cosine wave signal Ss and Sc after conversion respectively, to invert them. As a result, a sine wave signal and cosine wave signal Ss and Sc after conversion of which waveforms are shown in FIGS. 15(C) and (F) are outputted as the first and the fourth clock signals φ1 and φ4 from the first and the fourth buffers 174 and 177, and a sine wave signal and a cosine wave signal Ss and Sc after inversion of which waveforms are shown in FIGS. 15(D) and (E) are outputted as the second and the third signals φ2 and φ3 from the first and the second NOT circuits 178 and 179.

In this way, the multiphase clock signal generator 171 for generating four-phase clock signals uses the sine/cosine oscillator, which allows simpler circuit configuration. As a result, it is possible to reduce the circuit scale of the multiphase clock signal generator 171 to a considerable extent. Furthermore, there is no need of disposing a circuit which is required to operate at a frequency higher than the clock frequency fc within the multiphase clock signal generator 171, so that when the number N of the clock signals is set at 4, the signal processing unit for frequency conversion can be readily integrated into a single integrated circuit including the multiphase clock signal generator. Accordingly, in the case where the number of clock signals is 4, it is possible to reduce the production cost of the receiver and to reduce the power consumption of the signal processing unit with ease.

The receivers according to the first to fifth embodiments has been described as being used in FM radio communications. In the receiver provided with the signal processing unit for frequency conversion according to the invention, since the above-mentioned signal processing unit doesn't depend on the modulation processing system of received signals, it can be applied not only to a receiver which receives frequency-modulated electromagnetic waves but also to a receiver which receives electromagnetic waves modulated with other modulation systems. The other modulation systems include, for example, an amplitude modulation, a phase modulation and a multiphase amplitude phase modulation. And the receiver including the signal processing unit may be not only a radio communication apparatus but also a wire communication apparatus. In addition, the signal processing unit may be used in other apparatuses insofar as the apparatuses perform processing for frequency conversion on object signals, and may be used separately.

For example, in a general receiver in a portable telephone network of a digital system using π/4 shift QPSK (quadrature phase shift keying) modulation system, for avoiding the interference between signs, an input signal is subjected to limiting processing at a limiter after being passed through an IF filter having a root Nyquist characteristic or Nyquist characteristic, and thereafter a phase modulation component is extracted from the input signal after limiting processing to demodulate an original base band signal. In order to use the receiver of the invention as the above-described receiver in the portable telephone network, at least one of the digital filters within the signal processing unit should be set up as a Nyquist filter and the FM modulation unit should be replaced with the phase demodulation circuit for demodulating a base band signal from the phase demodulation component.

In the receivers according to the first to fifth embodiments, the sum-of-products arithmetic unit for performing decimation processing is supplied with any one of the clock signals φ1–φN all supplied to the multiphase sampling unit. The sum-of-products arithmetic unit may operate with a timing based on the operating frequency the same as those of the clock signals φ1–φN. Therefore, any one of the clock signals φ1–φN may be supplied to the multiphase sampling unit, or other clock signals having a frequency the same as that of the one of the clock signals φ1–φN and of which phase is different from that of the one of the clock signals φ1–φN. In addition, in the receiver according to the first to fifth embodiments, it is actually preferable that the sum-of-products arithmetic unit serving as the channel selection processing unit 29 performs a so-called interpolation processing in addition to the decimation processing.

In the receivers according to the first to fifth embodiments, the sample signals S1–SN are analogue signals. The multiplication coefficients h1–hN are often memorized as digital signals. Therefore, the part performing the multiplication within the sum-of-products arithmetic unit 53 preferably has such a circuit configuration that can calculate the product of an analogue signal and a digital signal. Consequently, the sum-of-products arithmetic unit 53 need not to be provided with a circuit for analogue/digital conversion of sample signals and a circuit for digital/analogue conversion of the product, which simplifies the circuit configuration of the sum-of-products arithmetic unit 53. In this way, the entire circuit configuration of the arithmetic processing unit 36 is simplified, so that it is easy to minimize and integrate the arithmetic processing unit 36, which allows reduction of manufacturing costs.

A first and a second multiplication circuits capable of calculating the product of the analogue signal and the digital signal will be schematically described below. In the following description, the digital signal as a multiplication object is of α bits. Here α is a natural number.

The configuration of the first multiplication circuit will be described below. The multiplication circuit includes α coupling condensers and α multiplication units. All of the coupling condensers, that is, the first to αth coupling condensers, are mutually connected. Input terminals of the coupling condensers are connected to output terminals of first to αth arithmetic units, respectively. That is to say, all of the coupling condensers are connected in parallel to form a capacity coupling where each contact of the output terminals of the condensers becomes output terminals of the capacity coupling. The internal configurations of all the processing units are mutually equal.

The capacity of each of the coupling condensers corresponds to the weight of each bit of the digital signal of a multiplication object, respectively. The bit signals b1–bα of voltages corresponding to α bits from the least significant bit to the most significant bit of the digital signal of a multiplication object are supplied to the digital input terminals of the first to Eth multiplication units in the previous stages of the first to αth coupling condensers, respectively. The analogue signal X or a multiplication object is supplied as it is to each analogue input terminal of the first to αth multiplication units.

The kth multiplication unit (k is an integer which is 1 or more and not more than α) which may be any one of the multiplication units includes one operational amplifier, first and the second TFTs, first and the second condensers, input terminals for analogue and for digital and output terminals. The source terminal of the first TFT is connected to the drain terminal of the second TFT and also to one terminal of the first condenser. The other terminal of the first condenser is connected to one terminal of the second condenser and the other terminal of the second condenser is grounded. The source terminal of the second TFT is grounded. The gate terminals of the first and the second TFTs are both connected to the digital input terminal of the kth multiplication unit. The output terminal of the operational amplifier is connected to the drain terminal of the first TFT. The inverted input terminal of the operational amplifier is connected to a first contact between the other terminal of the first condenser and one terminal of the second condenser. The non-inverted input terminal of the operational amplifier is connected to the analogue input terminal of the kth multiplication unit. The output terminal of the kth multiplication unit is connected to a second contact between the source terminal of the first TFT and the drain terminal of the second TFT. The switching characteristics of the first and the second TFTs are set so that the first and the second TFTs form a mutual toggle.

In the kth multiplication unit, any one of the bit signals bk is supplied to the gate terminals of the first and the second TFTs. The analogue signal X is supplied to the non-inverted input terminal of the operational amplifier. The operational amplifier within the kth multiplication unit amplifies and outputs the analogue signal X inputted. And the operational amplifier adjusts the amplification ratio of the analogue signal so that an output voltage Vamp of the operational amplifier makes the difference between the voltage of the analogue signal X and a voltage VP1 of the first contact 0. As a result, a voltage Vko of the output terminal of the kth multiplication unit is expressed by the following Expression 9. "Ck1" and "Ck2" are the capacities of the first and the second condensers within the kth multiplication unit.

$$Vko = X \times \{(Ck1+Ck2) \div Ck1\} (k=1, 2, \ldots \alpha) \tag{9}$$

The capacity coupling assigns weights to voltages V1o to Vαo from the first to αth multiplication units in accordance with the weight of bit corresponding to the bit signal supplied to each multiplication unit and integrates them. A capacity CCk of the kth coupling condenser in the following stage of the kth multiplication unit is defined to satisfy the relationship of Expression 10. As a result, an output voltage Vout generated at the output terminal of the capacity coupling is shown as Expression 11. In this way, at the connected terminal of the capacity coupling, the voltage Vout representing the product of the numeric value of the voltage of the analogue signal and the numeric value of the digital signal are generated. Further, the capacity CCk of the kth coupling condenser in the following stage of the kth multiplication unit may be defined so as to satisfy the relationship of Expression 12, and in that case, the final result is obtained by further multiplying the voltage Vout of the output terminal of the capacity coupling by the sum of the capacitances of all the coupling condensers. Such a multiplication circuit is already proposed in Japanese Unexamined Patent Publication JP-A 6-162230 (1994) by the present applicant. The above is a description of the first multiplication circuit.

$$\{(Ck1+Ck2) \div Ck1\} \times CCk = 2^{k-1} \tag{10}$$

$$Vout = (CC1 \times V1o + CC2 \times V2o + \ldots + CC\alpha + V\alpha o) \div (CC1 + CC2 + \ldots + CC\alpha) \tag{11}$$

$$\{(Ck1+Ck2) \div Ck1\} \times CCk \div (CC1+CC2+ \ldots +CC\alpha) = 2^{k-1} \tag{12}$$

The configuration of the second multiplication circuit will be described below. The multiplication circuit includes a bit condensers, only one sign condenser, α+1 switches, a first inverter circuit, a first feedback root condenser, a first intervening condenser. Output terminals of all of the bit condensers, that is, the first to αth bit condensers and the sign condensers are mutually connected. Input terminals of all of the bit condensers and sign condensers are connected to the output terminals of the first to α+1th switches, respectively. The input terminals of the first to the αth switches are connected mutually, and to the contact of those input terminals, the input terminal of the α+1th switch is connected via the first intervening condenser and the first inverter circuit in this order. That is to say, all of the bit condensers and the sign condensers are connected in parallel to form a capacity coupling, of which output terminal is a contact of the respective output terminals of the condensers.

The capacity of each bit condenser corresponds to the weight of each bit of the multiplication objective digital signal, respectively, and the capacity of the sign condenser corresponds twice the weight of the most significant bit of the the digital signal. Specifically, the capacities of the first to αth bit condensers and the sign condenser are $2^0$ times the predetermined reference capacity to $2^\alpha$ times the predetermined reference capacity, respectively. In the first inverter circuit, a feedback route including a first feedback route condenser is provided. The capacities of the first feedback route condenser and the first intervening condenser are equal. The above switchs are implemented by, for example, CMOSs (Complementary Metal-Oxide-Semiconductor).

Bit signals b1 to bα of the voltages corresponding to α bits from the least significant bit to the most significant bit of the multiplication objective digital signal, and a sign signal s of the voltage corresponding to each bit which represents a sign of the numeric value of the digital signal are supplied to each of the switches, respectively, as control signals to control open/close of the first to α+1th switches in the previous stage of the first to αth bit condenser and the sign condenser. The multiplication objective analogue signal X is supplied to the first to αth switches as it is, respectively. And the analogue signal X is supplied to the first inverter circuit via the first intervening condenser to be inverted, and the analogue signal after inversion is supplied to the α+1th switch. The first to α+1th switches conduct and interrupt the analogue signal in response to each of the bit signals b1 to bα and the level of the sign signals, respectively. As a result, the voltage V1 of the output terminal of the capacity coupling is shown as the following Expression 13. Here "bi" is the least significant to the most significant bits of the digital signal itself, and "s" is "−1" when the sign of the digital signal is "−," and is "1" when the sign is "+." As a result, at the connection terminal of the capacity coupling, generates the voltage representative of the product of a numeric value the voltage of the analogue signal exhibits and a numeric value the digital signal exhibits.

$$V1 = X \times \left\{ \sum_{i=1}^{\alpha} (2^{i-1} \times b^1) - 2^\alpha \times s \right\} \tag{13}$$

In addition, to the output terminal of the capacity coupling, a second inverter circuit provided with a feedback route including a second feedback route condenser is connected, and to the output terminal of the second inverter circuit, via a second intervening condenser, a third inverter circuit provided with a feedback route including a third feedback route condenser may be connected. The capacity of the second feedback route condenser is equal to the total sum of the capacities of all of the condensers of the capacity coupling. The capacity of the second intervening condenser is equal to that of the third feedback route condenser. The voltage at the output terminal of the second inverter circuit is the voltage of which absolute value is equal to the voltage V1 generating at the output terminal of the capacity coupling and of which sign is opposite to that of the V1. The voltage at the output terminal of the third inverter circuit is equal to the voltage V1 generating at the output terminal of the capacity coupling. In this way, the multiplication circuit can determine the product of both the signals using the digital signal and the analogue signal as they are, and can perform the processing to invert or not to invert the voltage V1 exhibiting the product according to the sign bit of the digital signal. Such a multiplication circuit is disclosed in Japanese Unexamined Patent Publication JP-A 6-168349 (1994) by the present applicant. The above describes the second multiplication circuit.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be therein.

What is claimed is:

1. A signal processing apparatus comprising:
   clock signal generating means for generating a plurality of clock signals of which frequencies are mutually equal and of which phases are different from each other;

a plurality of sampling means to which an input signal including signal components as processing objects within a predetermined input frequency band is supplied in parallel, which sampling means samples the input signal according to any one of the plurality of clock signals and outputs the sampled input signal sequentially as a sample signal;

sum-of-products operating means for periodically finding, with a timing based on an operating frequency which is equal to the frequency of the plurality of clock signals, a total sum of products of each of the sample signals outputted from all of the sampling means respectively and each of a plurality of predetermined multiplication coefficients; and output filter means for only passing components within an output frequency band which is different from the input frequency band, in a sum-of-products signal which is constituted of the total sums of products aligned in order of being found.

2. The signal processing apparatus of claim 1, further comprising:

multiplication coefficient changing means for changing each of the plurality of multiplication coefficients.

3. The signal processing apparatus of claim 1, further comprising:

a plurality of re-sampling means interposed between the plurality of sampling means and the sum-of-products operating means, respectively, for sampling the sample signal outputted from each of the sampling means based on a clock signal delayed in phase from the clock signal supplied to each of the sampling means to output it to the sum-of-products operating means, wherein the clock signals supplied to each of the sampling means are mutually equal.

4. The signal processing apparatus of claim 1, wherein the frequency of the clock signals is equal to or less than twice the upper limit frequency of the input frequency band; and the output frequency band is lower than the input frequency band.

5. The signal processing apparatus of claim 1, further comprising:

buffer amplification means provided in the previous stage of all of the sampling means.

6. The signal processing apparatus of claim 1, further comprising:

halt indication means for indicating a halt of sampling of the input signal, wherein the clock signal generating means halts the generation of clock signals while the halt indication means indicates the halt of sampling.

7. The signal processing apparatus of claim 1, wherein the plurality of clock signals are 4-phase clock signals.

8. The signal processing apparatus of claim 1, further comprising:

a plurality of memory elements which are respectively connected in series to the next stage of each of the sampling means, wherein each of the sampling means supplies the sample signal to the sum-of-products operating means and at the same time stores the sample signal in the memory element in the next stage of the sampling means, and each of the memory elements transfers the stored sample signal to the memory element of the next stage to store therein, with a timing defined based on the clock signal supplied to each of the sampling means in the previous stage of each of the memory elements, and gives the sample signal to the sum-of-products operating means.

9. A communication apparatus comprising:

receiving means for receiving the input signal;

the signal processing apparatus of claim 1; and demodulation means for demodulating an output signal outputted from the output filter means in the signal processing apparatus.

10. The communication apparatus of claim 9, further comprising:

intermediate filter means provided in the previous stage of the plurality of sampling means; and a plurality of intermediate sampling means interposed between the receiving means and the intermediate filter means, wherein each of the intermediate sampling means samples the input signal according to any one of all the clock signals, respectively, and sequentially outputs part of the input signal as an intermediate sample signal;

each of the intermediate filter means only passing signal components within a predetermined passing frequency band in an intermediate signal constructed by aligning the intermediate sample signals outputted from all of the intermediate sample means respectively in order of being sampled; and each of the sampling means samples the signal components within the passing frequency band in the intermediate signal.

11. The communication apparatus of claim 10, further comprising:

detector means for detecting amplitude modulation components in the input signal; and filter controlling means which discriminates whether interference components interfering the signal components as processing objects are included in the input signal based on the detected amplitude modulation components, and only when the interference components are included, changes frequency characteristics of at least any one of the sum-of-products operating means, the intermediate filter means and the output filter means, to frequency characteristics for removing the interference components.

12. The communication apparatus of claim 9, wherein a frequency of the output signal is equal to an effective sampling frequency which is the product of the frequency of the clock signals and the number of the sampling means, or equal to the frequency which is one integers of the effective sampling frequency.

13. The communication apparatus of claim 12, wherein an order of the sum-of-products operating means which is smaller by one than a number of sample signals used for one-time arithmetic processing thereof is smaller than a decimation number which is a ratio of the frequency of the sum-of-products signal to the frequency of a multiphase sample signal constructed by aligning the sample signals in time order of being sampled.

14. The communication apparatus of claim 12, wherein the sum-of-products operating means performs arithmetic processing for implementing a finite impulse response FIR filter and that at least one of the plural multiplication coefficients in the arithmetic processing is zero.

* * * * *